US012601777B2

(12) United States Patent
Lin et al.

(10) Patent No.: US 12,601,777 B2
(45) Date of Patent: Apr. 14, 2026

(54) INSPECTION SYSTEM AND METHOD FOR INSPECTING LIGHT-EMITTING DIODES

(71) Applicant: Industrial Technology Research Institute, Hsinchu (TW)

(72) Inventors: Yan-Rung Lin, Hsinchu (TW);
Chung-Lun Kuo, New Taipei (TW);
Chia-Liang Yeh, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 198 days.

(21) Appl. No.: 18/334,387

(22) Filed: Jun. 14, 2023

(65) Prior Publication Data

US 2024/0110968 A1        Apr. 4, 2024

(30) Foreign Application Priority Data

Sep. 30, 2022    (TW) .................................. 111137243

(51) Int. Cl.
*G01R 31/26*        (2020.01)
*G01R 31/44*        (2020.01)
(52) U.S. Cl.
CPC ......... *G01R 31/2635* (2013.01); *G01R 31/44* (2013.01)
(58) Field of Classification Search
CPC ............................ G01R 31/2635; G01R 31/44
See application file for complete search history.

(56) References Cited

U.S. PATENT DOCUMENTS 5,311,137 A * 5/1994 Chang ................... G02F 1/1309
                                                        324/501
5,444,385 A * 8/1995 Henley ................. G02F 1/1309
                                                        324/750.22

(Continued)

FOREIGN PATENT DOCUMENTS

TW          202024661          7/2020
TW          I703656          9/2020

(Continued)

OTHER PUBLICATIONS

"Office Action of Taiwan Counterpart Application", issued on Apr. 30, 2024, p. 1-p. 9.

(Continued)

*Primary Examiner* — Eman A Alkafawi
*Assistant Examiner* — Suresh K Rajaputra
(74) *Attorney, Agent, or Firm* — JCIPRNET

(57)                    ABSTRACT

An inspection system includes an excitation light source, a voltage-sensing film, an illumination light source, an image capture device. The excitation light source provides an excitation beam to light-emitting diodes to generate open-circuit voltages. The voltage-sensing film is at a top side of the light-emitting diodes and includes a voltage-sensing medium layer and a first electrode layer. The first electrode layer is in the voltage-sensing medium layer to provide a gain effect of the open-circuit voltages, so that the voltage-sensing medium layer senses the open-circuit voltages, and a display of the voltage-sensing medium layer is changed with a portion or all of the open-circuit voltages. The illumination light source provides an illumination beam to the voltage-sensing film to generate a sensing image according to a display change. The image capture device is on a transmission path of the sensing image and receives the sensing image to generate an inspection result.

27 Claims, 16 Drawing Sheets

(56) References Cited

U.S. PATENT DOCUMENTS

| | | | | |
|---|---|---|---|---|
| 5,459,409 A | * | 10/1995 | Henley | G02F 1/1309 |
| | | | | 324/530 |
| 11,002,783 B2 | | 5/2021 | Lin et al. | |
| 2008/0224724 A1 | * | 9/2008 | Glazer | G09G 3/006 |
| | | | | 324/754.23 |
| 2019/0004105 A1 | * | 1/2019 | Henley | G01R 29/0821 |
| 2020/0200817 A1 | | 6/2020 | Lin et al. | |
| 2020/0371152 A1 | * | 11/2020 | Lin | G01R 31/2635 |
| 2021/0231570 A1 | * | 7/2021 | Lin | G01N 21/95 |

FOREIGN PATENT DOCUMENTS

| | | |
|---|---|---|
| TW | 202201035 | 1/2022 |
| TW | 202226639 | 7/2022 |

OTHER PUBLICATIONS

Kun Wang et al., "Electroluminescence from µLED without external charge injection", Scientific Reports, May 15, 2020, pp. 1-8, vol. 10, No. 8059.

* cited by examiner

INSPECTION SYSTEM AND METHOD FOR INSPECTING LIGHT-EMITTING DIODES

CROSS-REFERENCE TO RELATED APPLICATION

This application claims the priority benefit of Taiwan application serial no. 111137243, filed on Sep. 30, 2022. The entirety of the above-mentioned patent application is hereby incorporated by reference herein and made a part of this specification.

TECHNICAL FIELD

The disclosure relates to an inspection system and a method for inspecting light-emitting diodes.

BACKGROUND

With the development of light-emitting diode display techniques, the size of light-emitting diode dies is gradually reduced to several micrometers (μm). It is desired to ensure high yield during the mass transfer of light-emitting diodes to avoid repair of back-end products. Moreover, when the size of the light-emitting diode dies is very small, repair is almost impossible, thus causing defects in the display and affecting the process yield, and thus affecting costs. Therefore, how to screen out light-emitting diode dies that work normally, or to further screen out light-emitting diode dies with uniform quality, is an important inspection technique.

When the overall size of the light-emitting diodes is reduced, the size of the electrodes of the light-emitting diodes is also reduced. Therefore, when inspecting the light-emitting diodes, the probe of the inspection device is not readily aligned with the electrodes of the light-emitting diodes, and the tip of the probe needs to match the size of the electrodes of the light-emitting diodes and has a very small size. A probe with an extremely small-sized tip is difficult to manufacture, and during the inspection process, the tip of the probe needs to be in contact with the electrodes of the light-emitting diodes, and is readily worn out. In addition, in a general inspection method, the probe needs to be in contact with a plurality of electrodes of a plurality of light-emitting diodes in sequence, and the inspection process is expensive and time-consuming.

SUMMARY

The disclosure provides an inspection system and a method for inspecting light-emitting diodes that may quickly inspect a huge number of light-emitting diodes.

The disclosure provides an inspection system for inspecting a plurality of light-emitting diodes, including an excitation light source, a voltage-sensing film, an illumination light source, and an image capture device. The excitation light source is adapted to provide an excitation beam to the plurality of light-emitting diodes so that the plurality of light-emitting diodes generate a plurality of open-circuit voltages. The voltage-sensing film is located at a top side of the plurality of light-emitting diodes and configured to generate a display change according to a driving voltage. The voltage-sensing film includes a voltage-sensing medium layer and a first electrode layer. The first electrode layer is disposed in the voltage-sensing medium layer to provide a gain effect of the plurality of open-circuit voltages, so that the voltage-sensing medium layer senses the plurality of open-circuit voltages, and a display of the voltage-sensing medium layer is changed with a portion or all of the plurality of open-circuit voltages. The illumination light source provides an illumination beam to the voltage-sensing film to generate a sensing image according to the display change. The image capture device is disposed on a transmission path of the sensing image and configured to receive the sensing image to generate an inspection result.

The disclosure further provides a method for inspecting light-emitting diodes, including: a step of providing an excitation beam to the plurality of light-emitting diodes so that the plurality of light-emitting diodes generate a plurality of open-circuit voltages; a step of providing an open-circuit voltage gain effect to a voltage-sensing medium layer of a voltage-sensing film; a step of sensing a plurality of open-circuit voltages via the voltage-sensing medium layer, and a display of the voltage-sensing medium layer is changed with a portion or all of the plurality of open-circuit voltages, so that the voltage-sensing film generates a display change; a step of providing an illumination beam to the voltage-sensing film to generate a sensing image according to the display change; and a step of capturing the sensing image to generate an inspection result.

Based on the above, in the inspection system and the method for inspecting light-emitting diodes of the disclosure, the excitation beam is provided to the plurality of light-emitting diodes so that the plurality of light-emitting diodes generate the plurality of open-circuit voltages, and the voltage-sensing film generates the display change according to the plurality of driving voltages. In particular, the voltage-sensing film includes the voltage-sensing medium layer and the first electrode layer. The first electrode layer is disposed in the voltage-sensing medium layer to provide the gain effect of the plurality of open-circuit voltages, so that the voltage-sensing medium layer senses the plurality of open-circuit voltages, and the display of the voltage-sensing medium layer is changed with a portion or all of the plurality of open-circuit voltages. Then, the illumination beam is provided to the voltage-sensing film to generate the sensing image according to the display change, and the sensing image is captured to generate the inspection result. In this way, voltage sensing may be performed on the plurality of light-emitting diodes via the voltage-sensing film, and corresponding display change may be generated according to the driving voltage, so as to obtain a sensing image assembled by generating the bright and dark or color changes in the corresponding region for inspection. The open-circuit voltages of the plurality of light-emitting diodes are obtained according to the inspection result, so that the quality of each of the light-emitting diodes may be determined from electrical characteristic data, so as to achieve rapid inspection of a large number of light-emitting diodes.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
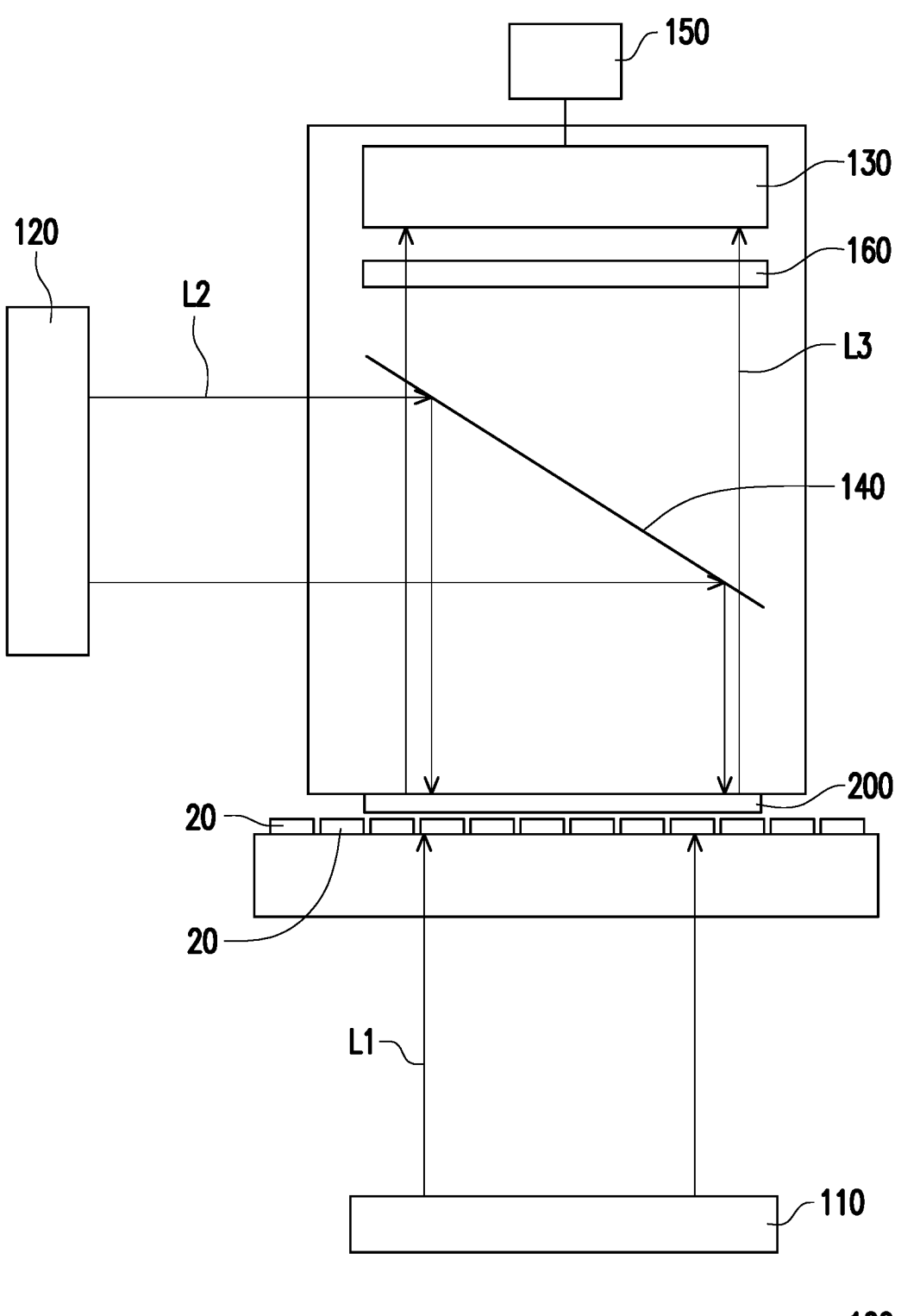
FIG. 1 is a schematic diagram of an inspection system of an embodiment of the disclosure.

FIG. 1 is a schematic diagram of an inspection system of an embodiment of the disclosure. Please refer to FIG. 1. The present embodiment provides an inspection system 100 configured to inspect a plurality of light-emitting diodes 20, so as to achieve the object of non-contact inspection and fast and comprehensive inspection at the same time. Examples include micro light-emitting diodes (micro LEDs) before mass transfer. In the present embodiment, the inspection system 100 includes an excitation light source 110, a voltage-sensing film 200, an illumination light source 120, and an image capture device 130.

The excitation light source 110 is located at the bottom side of the plurality of light-emitting diodes 20 and configured to provide an excitation beam L1 to the plurality of light-emitting diodes 20 so that the plurality of light-emitting diodes 20 generate a plurality of open-circuit voltages (Voc). The electric field corresponding to the plurality of open-circuit voltages has a direction parallel to an extending direction of the substrate with the plurality of light-emitting diodes 20, that is, the horizontal direction. In detail, the excitation beam L1 simultaneously irradiates the plurality of light-emitting diodes 20. The wavelength of the excitation beam L1 is less than or equal to the emission wavelength of the light-emitting diodes 20. The excitation beam L1 may make the light-emitting diodes 20 generate a photovoltaic effect. Therefore, the open-circuit voltages refer to the potential difference generated between the positive and negative electrodes after the plurality of light-emitting diodes 20 without current passing through are irradiated by the excitation beam L1, and the potential difference is different according to the abnormal level of the respective light-emitting diodes 20. In a preferred embodiment, the excitation beam L1 is a parallel beam and has uniform light intensity. That is, the amount of each of the plurality of light-emitting diodes 20 irradiated by the excitation beam L1 at the same time may be substantially the same, but the disclosure is not limited thereto.

Figure 2A:
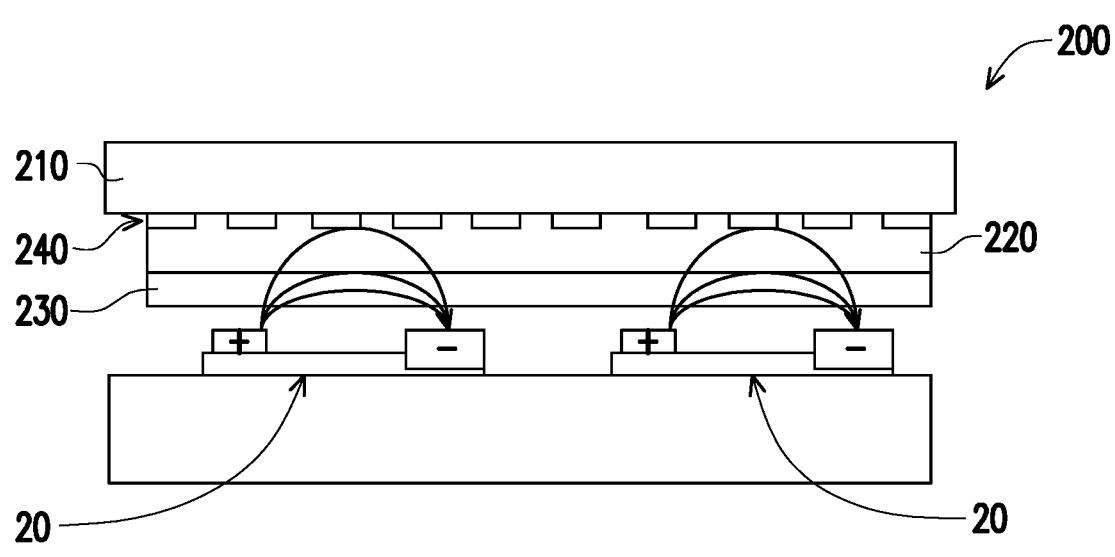
FIG. 2A and FIG. 2B are schematic diagrams of a voltage-sensing film approaching a plurality of light-emitting diodes of different embodiments of the disclosure, respectively.
Figure 2B:
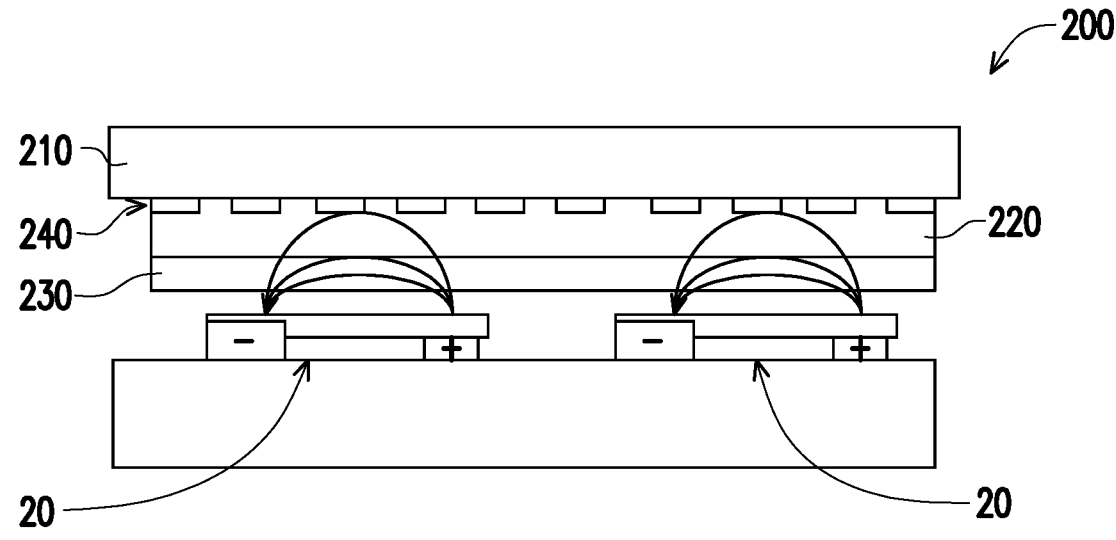

FIG. 2A and FIG. 2B are schematic diagrams of a voltage-sensing film approaching a plurality of light-emitting diodes of different embodiments of the disclosure, respectively. A voltage-sensing film 200 shown in FIG. 2A and FIG. 2B may be applied to at least the inspection system 100 shown in FIG. 1. Please refer to FIG. 1 and FIG. 2A first. The voltage-sensing film 200 is located at the top side of the plurality of light-emitting diodes 20 and configured to sense a plurality of open-circuit voltages to generate a display change (e.g., the color change or the transmittance change causes a change in grayscale). In detail, in the present embodiment, the voltage-sensing film 200 includes a first substrate 210, a voltage-sensing medium layer 220, a second substrate 230, and a first electrode layer 240. One of the first substrate 210 and the second substrate 230 has a supporting effect, and may be a glass substrate or a plastic substrate attached to the glass, and the other one is close to the plurality of light-emitting diodes 20, and may be a very thin polymer substrate with a thickness ranging from tens of micrometers to several micrometers. In other embodiments, the electrodes of the light-emitting diodes 20 are located below, as shown in FIG. 2B.

The voltage-sensing medium layer 220 is disposed between the first substrate 210 and the second substrate 230. The electric field corresponding to the working voltage of the voltage-sensing medium layer 220 has a direction parallel to a direction of the electric field corresponding to the plurality of open-circuit voltages of the plurality of light-emitting diodes 20 (as shown in FIG. 2A). For example, in the present embodiment, the voltage-sensing medium layer 220 is an in-plane switching (IPS) liquid crystal or a fringe field switching (FFS) liquid crystal, and the electric field corresponding to the working voltage thereof has a direction parallel to an extending direction of the substrate with the plurality of light-emitting diodes 20. In other words, the arrangement of liquid-crystal molecules of the voltage-sensing medium layer 220 may change according to the electric field corresponding to the open-circuit voltages of the plurality of light-emitting diodes 20 to generate a transmittance change. In another embodiment, the voltage-sensing medium layer 220 is a transverse bend mode (TBM) vertically-aligned liquid crystal, and the long axes of most of the liquid crystals tend to be parallel to the horizontal direction when a working voltage is applied. In another embodiment, the voltage-sensing medium layer 220 is a homogeneously-aligned bend (HAB) liquid crystal that may be bent under the influence of the vertical component electric field of the horizontal electrode. The above liquid crystals may be selected as positive or negative liquid crystals according to requirements, and the disclosure is not limited thereto. When liquid crystal is selected as the voltage sensing medium, according to the working principle thereof, after the illumination beam enters the liquid crystal and passes through the liquid crystal, the illumination beam respectively passes through polarizers with polarization directions perpendicular to each other. In different embodiments, the voltage-sensing medium layer 220 may also be selected from a medium layer that may change color or transmittance by voltage or electric field such as polymer-dispersed liquid crystal (PDLC), electrochromic layer, electrowetting layer, suspended particle layer, voltage-sensing nanoparticle, or voltage-sensitive dye, but the disclosure is not limited thereto.

The first electrode layer 240 is disposed at the voltage-sensing medium layer 220 and connected to the first substrate 210. However, in other embodiments, the first electrode layer 240 may be connected to the second substrate 230, and the disclosure is not limited thereto. Therefore, the voltage-sensing medium layer 220 generates the corresponding display change according to the driving voltage. The driving voltage is the same with the working voltage in the forgoing paragraph. In particular, in the present embodiment, the driving voltage is a combination of an applied bias voltage generated by the first electrode layer 240 and the plurality of open-circuit voltages. When the bias voltages provided by the first electrode layer 240 is fixed, the voltage-sensing medium layer 220 generates a corresponding display change according to the plurality of open-circuit voltages. An open-circuit voltage gain effect of the voltage-sensing medium layer 220 is implemented by applying the applied bias voltage to the first electrode layer 240. For example, the plurality of light-emitting diodes 20 include good light-emitting diodes and bad light-emitting diodes, and the open-circuit voltages of the bad light-emitting diodes are different from the open-circuit voltages of the good light-emitting diodes, and therefore different driving voltages are generated for the corresponding liquid-crystal molecules, thereby showing different grayscale.

Figure 2C:
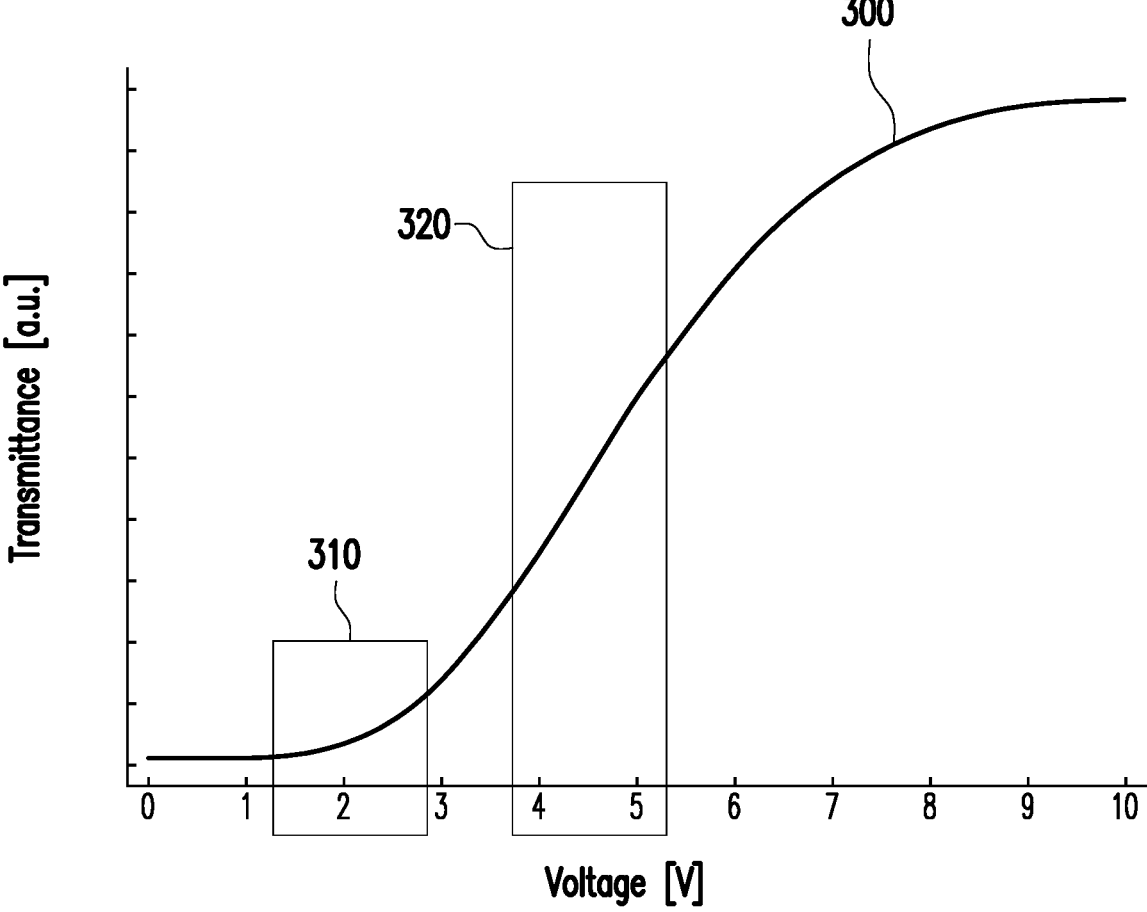
FIG. 2C is a graph of the transmittance of a voltage-sensing medium layer versus the voltage under a voltage-sensing film of an embodiment of the disclosure.

FIG. 2C is a graph of the transmittance of a voltage-sensing medium layer versus the voltage under a voltage-sensing film of an embodiment of the disclosure. Please refer to FIG. 2A and FIG. 2C. In particular, a curve 300 represents the change of the light transmittance of the voltage-sensing medium layer 220 versus the voltage under the voltage-sensing film. When the voltage-sensing film 200 is placed on the plurality of light-emitting diodes 20, the voltage under the voltage-sensing film is the open-circuit voltage of a diode. Traditionally, the open-circuit voltage of the plurality of light-emitting diodes 20 is a limited value, such as less than 2.5 V, and the limited value is varied according to the type of the diode. In this situation, the change of the transmittance corresponding to the voltage provided by the open-circuit voltage is not significant or unchanged, such as in a region 310. Ideally, when the voltage-sensing medium layer senses the open-circuit voltage of a diode, there is a change in transmittance, such as in a region 320.

Figure 2D:
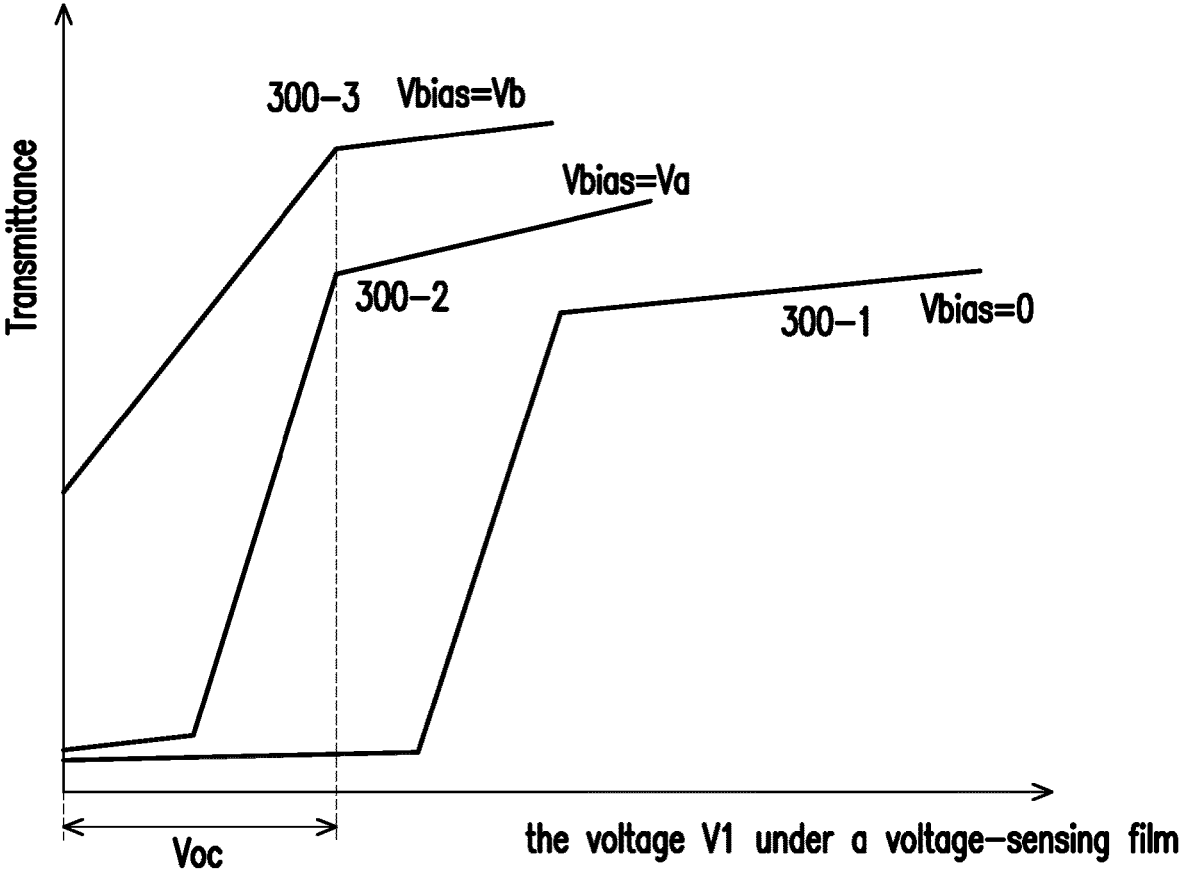
FIG. 2D is a graph of the transmittance of a voltage-sensing medium layer versus a voltage V1 under a voltage-sensing film of another embodiment of the disclosure.

FIG. 2D is a graph of the transmittance of a voltage-sensing medium layer versus the voltage V1 under a voltage-sensing film of another embodiment of the disclosure. The voltage-sensing film 200 generates a transmittance change according to the driving voltage. Please refer to FIG. 2A and FIG. 2D. Since the first electrode layer 240 provides an external voltage to the voltage-sensing medium layer 220, the external voltage is called a bias voltage (Vbias) in the present implementation as a portion of the driving voltage of the voltage-sensing medium layer 220. Therefore, a portion or all of the open-circuit voltages may fall within the working range where the transmittance of the voltage-sensing medium layer 220 is changed or changed significantly. As shown in a curve 300-1, when no bias voltage is applied to the first electrode layer 240, Vbias=0, and the transmittance in the range of the open-circuit voltages is changed slightly or almost not changed with the voltage under the voltage-sensing film. As shown in a curve 300-2, when the first bias voltage Vbias=Va is applied to the first electrode layer 240, the region where the transmittance of the curve is changed significantly may be moved to a smaller voltage. It means the bias voltage provided by the first electrode layer 240 providing a gain effect for open-circuit voltages. Now, when the open-circuit voltages greater than a certain threshold value, there is a significant difference in transmittance in the sensing image captured by the image capture module. However, when the open-circuit voltages are less than a certain threshold value, the voltage-sensing film 200 does not generate any transmittance change. The curve of the transmittance with a threshold value may screened out diodes with specific abnormal levels, and the threshold value setting varies according to requirement. In another embodiment, when the second bias voltage is applied to the first electrode layer 240, V bias=Vb, and the voltage range of the curve with an obvious transmittance change is shifted to smaller values. That is, any open-circuit voltage (Voc) may cause the transmittance of the voltage-sensing medium layer 220 changed. Now, the range of obvious transmittance change falls within the open-circuit voltages, and when the open-circuit voltages of the light-emitting diodes 20 are changed, there is a clear difference in transmittance shown in the sensing image captured by the image capture module.

The above driving voltage sensed by the voltage-sensing medium layer 220 is the combined effect of the applied bias voltage provided by the first electrode layer 240 and the plurality of open-circuit voltages. The effect of the open-circuit voltages generated in the voltage-sensing medium layer 220 is a certain ratio of the open-circuit voltages. This ratio is related to the thickness and the material of the sensing medium layer 220, the thickness and the material of the second substrate 230, and the size and the material of the gaps between the light-emitting diodes 20 and the second substrate 230. The threshold value or slope of curves 300-2 and 300-3 is affected, but are not limited to, by the thickness and the material of the sensing medium layer 220, the geometric size and the interval width of the first electrode, the interval width of the light-emitting diodes 20 and the bias voltage. The thickness and the material of the sensing medium layer 220, the geometric size and the interval width of the first electrode are called as the parameters of the voltage-sensing film. In the light-emitting diodes of a horizontal architecture, the electric field in the voltage-sensing medium layer 220 has a direction parallel to an extending direction of the substrate with the light-emitting diodes 20.

The illumination light source 120 is located at the top side of the plurality of light-emitting diodes 20 and configured to provide an illumination beam L2 to the voltage-sensing film 200 to generate a sensing image L3 according to a display change. In the present embodiment, the illumination light source 120 is a light source that may be sensed by the image capture device 130, so the illumination beam L2 is provided to the voltage-sensing film 200 to generate the sensing image L3 composed of bright and dark or color changes in corresponding regions according to the display change of different liquid-crystal molecules. The image capture device 130 is disposed on a transmission path of the sensing image L3 and configured to receive the sensing image L3 to generate an inspection result. In order to improve imaging contrast, a light filter 160, such as a high-pass filter or a bandpass filter, may be placed in front of the image capture device 130. In this way, most of the excitation beam L1 or light generated by photoluminescence may be further filtered out, thereby improving sensing quality. Specifically, the image capture device 130 captures a pattern in which the voltage-sensing film 200 changes color or transmittance under the influence of the voltage. The image capture device 130 is, for example, a combination of a microscope lens and a camera, but the disclosure is not limited thereto. In this way, voltage sensing may be performed on the plurality of light-emitting diodes 20 via the voltage-sensing film 200, and corresponding display change may be generated according to the open-circuit voltages, so as to obtain a sensing image assembled by generating the bright and dark or color changes in corresponding regions for inspection. The open-circuit voltages of the plurality of light-emitting diodes 20 are obtained according to the inspection result, so that the quality of each of the light-emitting diodes 20 (for example, using the obtained open-circuit voltages to classify each of the light-emitting diodes 20 as good or bad) may be determined from electrical characteristic data, so as to achieve rapid inspection of a large number of light-emitting diodes 20. In different embodiments, the excitation light source 110 and the illumination light source 120 may be configured by position exchange, but the disclosure is not limited thereto.

Specifically, in the present embodiment, the inspection system 100 further includes a light-splitting element 140 disposed on the transmission path of the illumination beam L2 and configured to reflect the illumination beam L2 to the voltage-sensing film 200 and allowing the sensing image L3 from the voltage-sensing film 200 to pass through. Moreover, the voltage-sensing film 200 further includes a reflective layer (not shown) disposed at the upper surface or the lower surface of the second substrate 230 and configured to reflect the illumination beam L2 through the voltage-sensing film 200 to generate a color or transmittance change and to the image capture device 130 for inspection, but the disclosure is not limited thereto. In an embodiment, a light reflection layer may be formed between the gap of PN electrodes on the plurality of light-emitting diodes 20. For example, the reflection layer is DBR (Distributed Bragg reflection layer) of LED, to reflect the illumination beam L2 but the disclosure is not limited thereto.

Figure 3A:
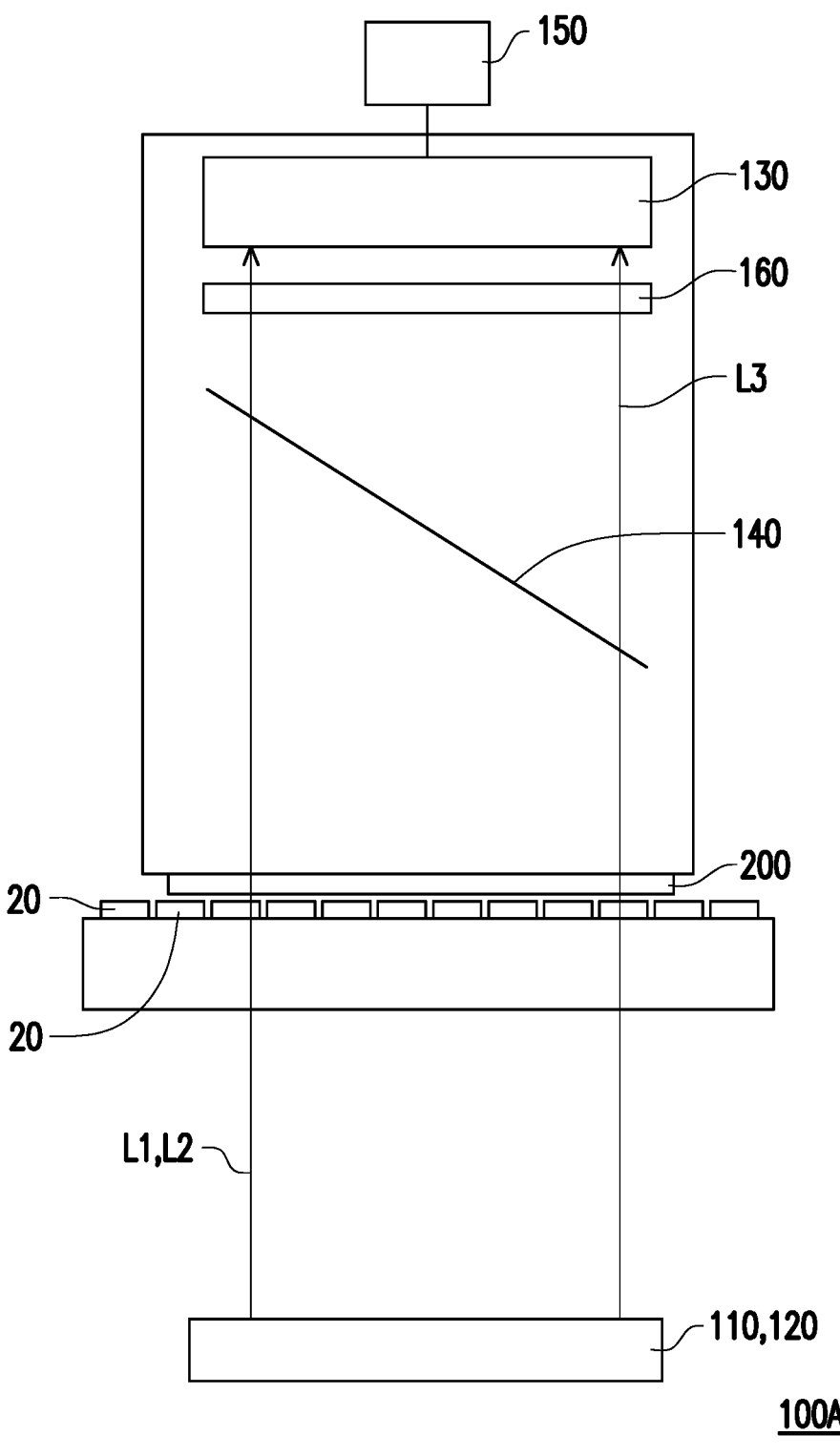
FIG. 3A is a schematic diagram of an inspection system of another embodiment of the disclosure.

FIG. 3A is a schematic diagram of an inspection system of another embodiment of the disclosure. Please refer to FIG. 3A. An inspection system 100A of the present embodiment is similar to the inspection system 100 shown in FIG. 1. The difference between the two is that, in the present embodiment, the excitation light source 110 of the inspection system 100A is simultaneously used as the illumination light source 120. In detail, the excitation light source 110 and the illumination light source 120 are located at the bottom side of the plurality of light-emitting diodes 20 at the same time, and are substantially the same light-emitting device. Therefore, the excitation beam L1 is equivalent to the illumination beam L2 and transmitted to the plurality of light-emitting diodes 20 from the same direction to form a transmissive optical system. In addition, the light filter 160 is modified to use a light attenuator to suitably attenuate the excitation beam L1 passing through the plurality of light-emitting diodes 20. In this way, the configuration of an additional light source may be omitted, thereby reducing the volume of the inspection system 100A.

Figure 3B:
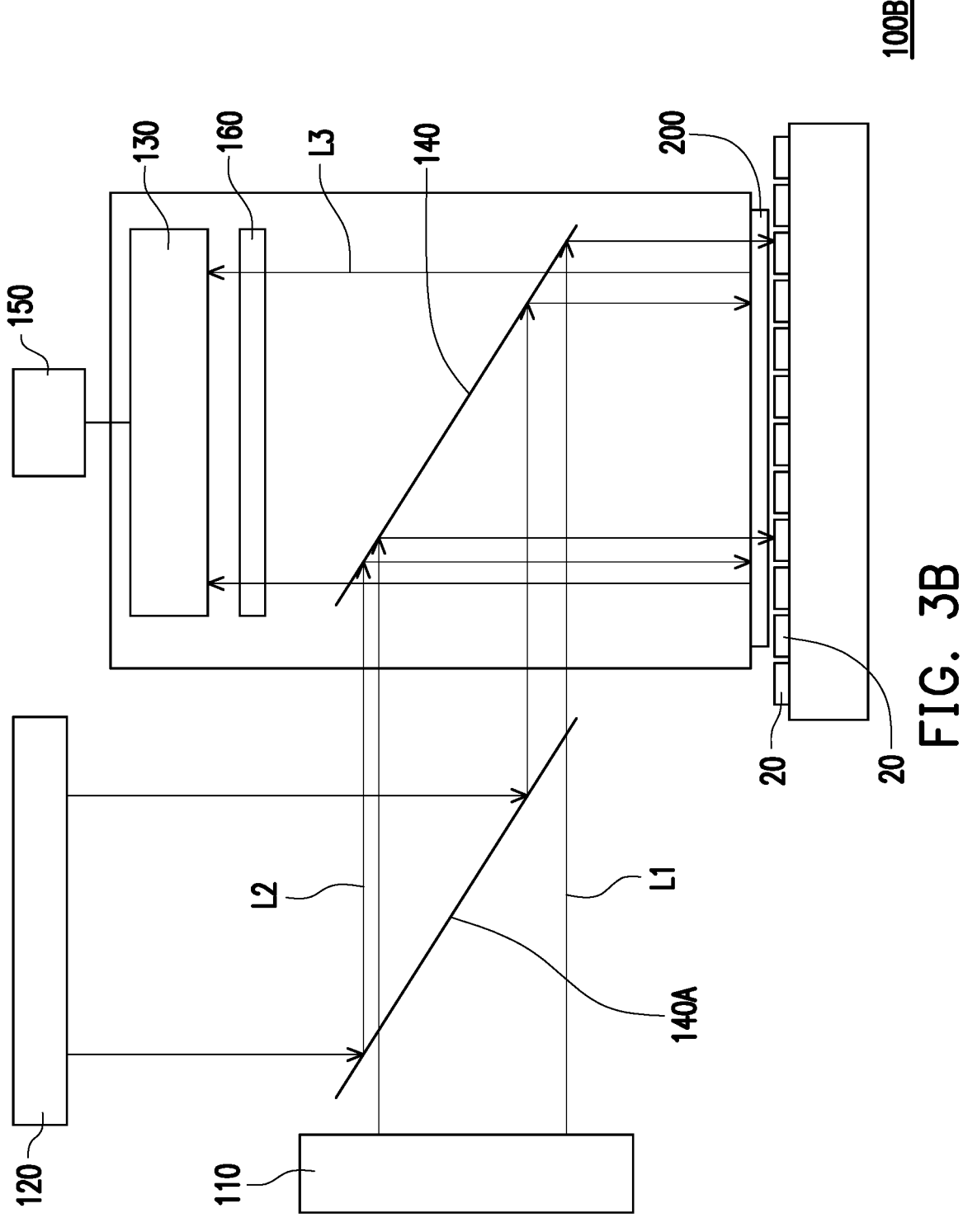
FIG. 3B is a schematic diagram of an inspection system of another embodiment of the disclosure.

FIG. 3B is a schematic diagram of an inspection system of another embodiment of the disclosure. Please refer to FIG. 3B. An inspection system 100B of the present embodiment is similar to the inspection system 100 shown in FIG. 1. The difference between the two is that, in the present embodiment, the excitation light source 110 and the illumination light source 120 of the inspection system 100B are located at the same side of the plurality of light-emitting diodes 20, and the light-splitting element 140 is also located on the transmission path of the excitation beam L1 and configured to reflect the excitation beam L1 to the voltage-sensing film 200. In detail, the excitation light source 110 and the illumination light source 120 may be configured by a light-splitting elements, and a light-splitting element 140A is additionally disposed to guide the excitation beam L1 and the illumination beam L2 to the light-splitting element 140. In this way, the light sources may be centrally arranged, thereby reducing the volume of the inspection system 100B. In another configuration, in the inspection system 100B, the embodiment in which the excitation light source 110 and the illumination light source 120 are further adjusted to design as the inspection system 100A. That is, the excitation light source 110 of the inspection system 100B is simultaneously used as the illumination light source 120, but the disclosure is not limited thereto.

Please refer further to FIG. 1. Moreover, in the present embodiment, the inspection system 100 further includes a processing element 150 electrically connected to the image capture device 130, and obtains the open-circuit voltages of the plurality of light-emitting diodes 20 according to the inspection result. Therefore, the quality of each of the light-emitting diodes 20 may be determined from electrical characteristic data. The processing element 150 is, for example, a central processing unit (CPU) or a general-purpose or special-purpose programmable microprocessor, digital signal processor (DSP), programmable controller, application-specific integrated circuit (ASIC), or other similar devices or a combination of the above devices, but the disclosure is not limited thereto.

Figure 4A:
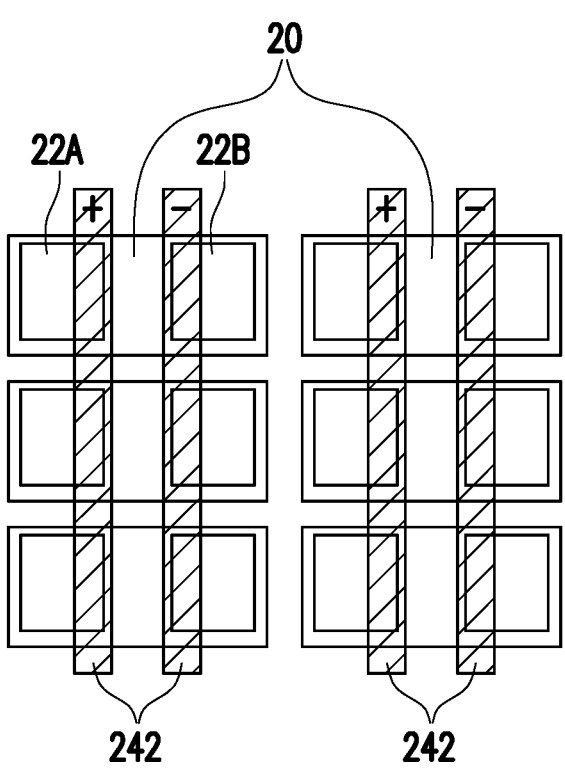
FIG. 4A to FIG. 4D are schematic top views of a first electrode layer and a plurality of light-emitting diodes of different embodiments of the disclosure, respectively.
Figure 4B:
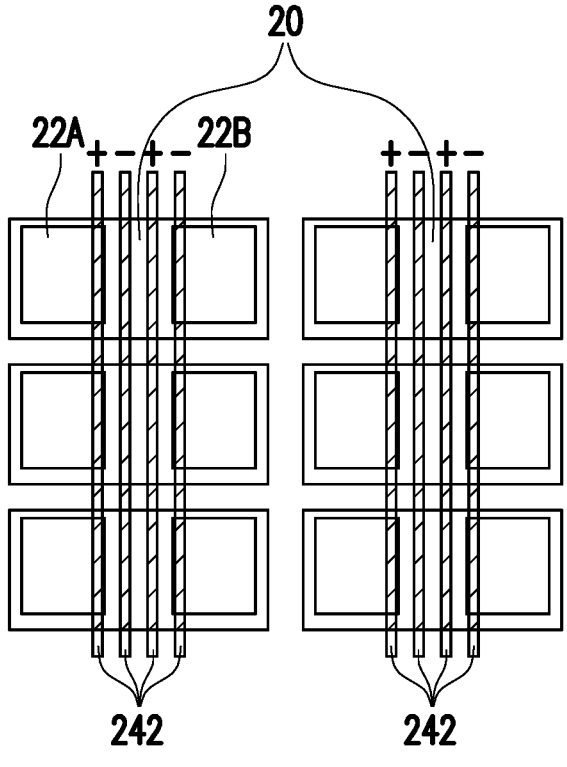
Figure 4C:
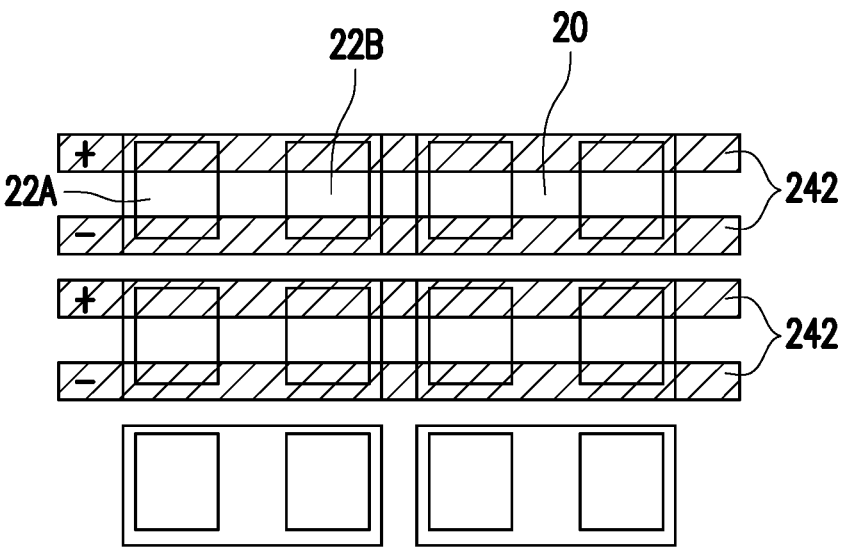
Figure 4D:
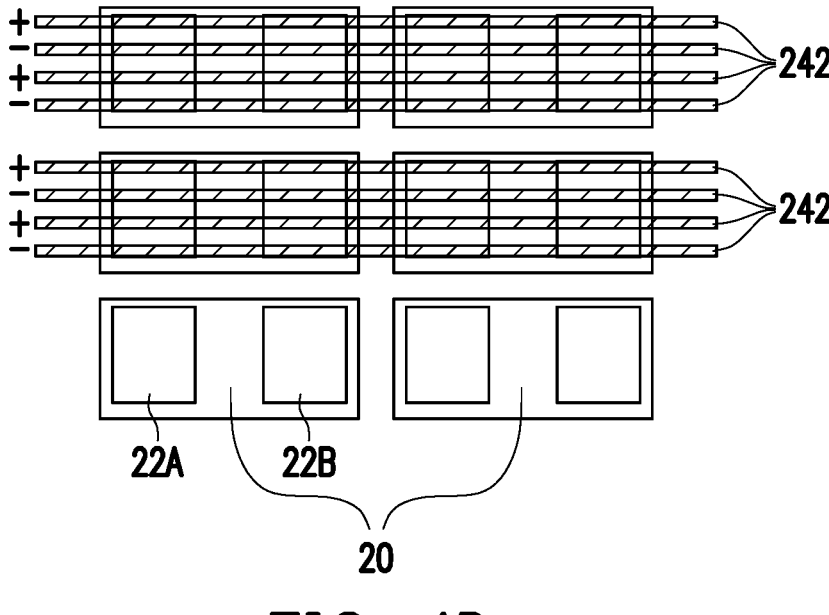

FIG. 4A to FIG. 4D are schematic top views of a first electrode layer and a plurality of light-emitting diodes of different embodiments of the disclosure, respectively. In the voltage-sensing film 200, the distribution of the first electrode layer 240 in the stacking direction to the projection of the plurality of light-emitting diodes 20 may be distributed in different ways according to different requirements. Please refer to FIG. 2A and FIG. 4A first. In the embodiment of FIG. 4A, the arrangement direction of the first electrode layer 240 is parallel to the arrangement direction of the electrodes in the plurality of light-emitting diodes 20. In detail, the first electrode layer 240 includes a plurality of strip electrodes 242 arranged at intervals along the arrangement direction, and the plurality of strip electrodes 242 are activated to provide an external bias voltage. Moreover, the plurality of light-emitting diodes 20 include a plurality of device electrodes 22A and 22B (for example, P electrodes and N electrodes, respectively). The arrangement direction of the plurality of strip electrodes 242 is parallel to the arrangement direction of the plurality of device electrodes 22A and 22B, and the number of the plurality of strip electrodes 242 is equal to the number of the plurality of device electrodes 22A and 22B. In the embodiment of FIG. 4B, the number of the plurality of strip electrodes 242 may be designed to be an integer multiple of the number of the plurality of device electrodes 22A and 22B. Alternatively, the number of the plurality of strip electrodes 242 may be designed to be a non-integer multiple of the number of the plurality of device electrodes 22A and 22B according to different requirements, and the disclosure is not limited thereto. In the embodiment of FIG. 4C, the arrangement direction of the plurality of strip electrodes 242 is perpendicular to the arrangement direction of the plurality of device electrodes 22A and 22B, and the number of the plurality of strip electrodes 242 is equal to the number of the plurality of device electrodes 22A and 22B. In the embodiment of FIG. 4D, the number of the plurality of strip electrodes 242 in the embodiment of FIG. 4C may be designed to be an integer multiple of the number of the plurality of device electrodes 22A and 22B, and the disclosure is not limited thereto.

Figure 5A:
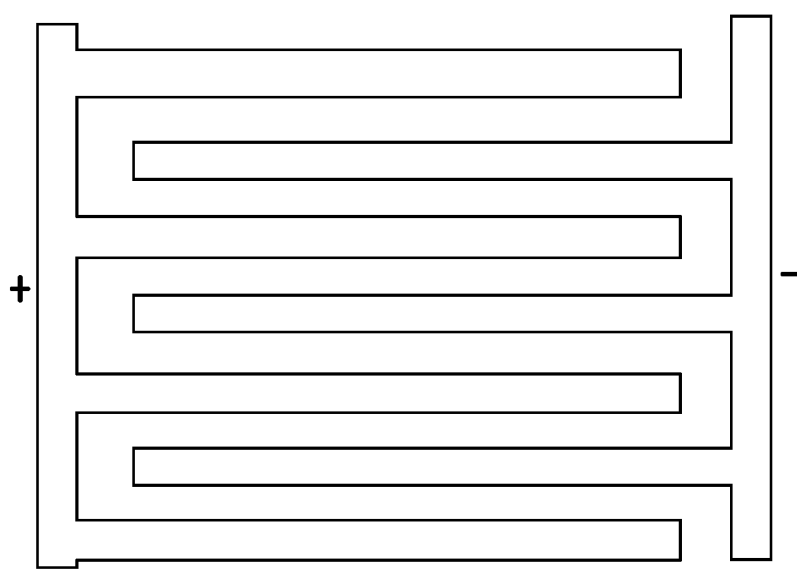
FIG. 5A and FIG. 5B are a schematic top view and a schematic cross-sectional view of a first electrode layer of different embodiments of the disclosure, respectively.
Figure 5B:
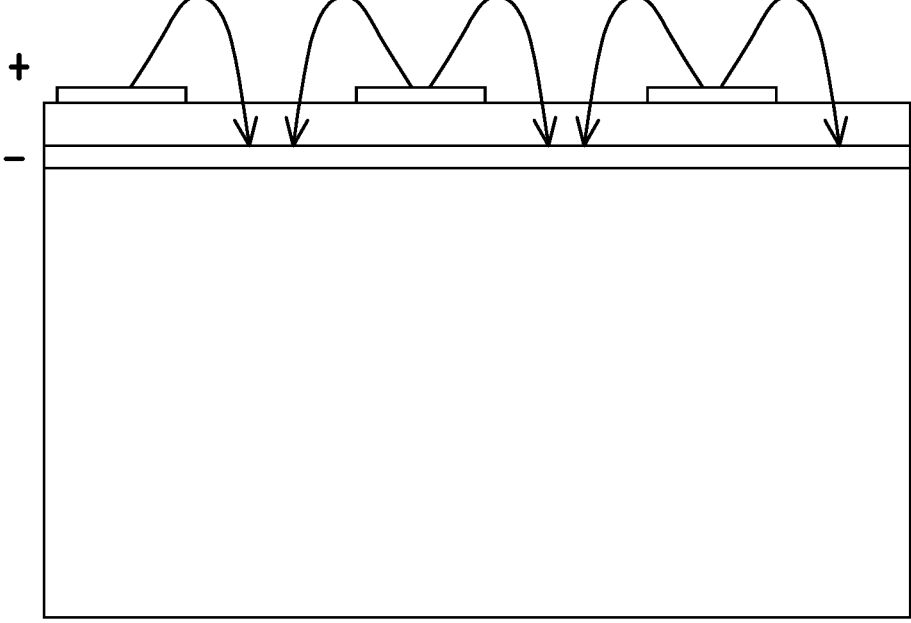

FIG. 5A and FIG. 5B are a schematic top view and a schematic cross-sectional view of a first electrode layer of different embodiments of the disclosure, respectively. Please refer to FIG. 5A and FIG. 5B. In any of the embodiments, the plurality of strip electrodes 242 may be designed in series according to the requirements thereof as positive electrodes or negative electrodes, so as to form an interdigitated shape, as shown in FIG. 5A. Alternatively, the plurality of strip electrodes 242 may also be distributed in two layers at different positions according to the requirements thereof as positive electrodes or negative electrodes, as shown in FIG. 5B, but the disclosure is not limited thereto.

Figure 6A:
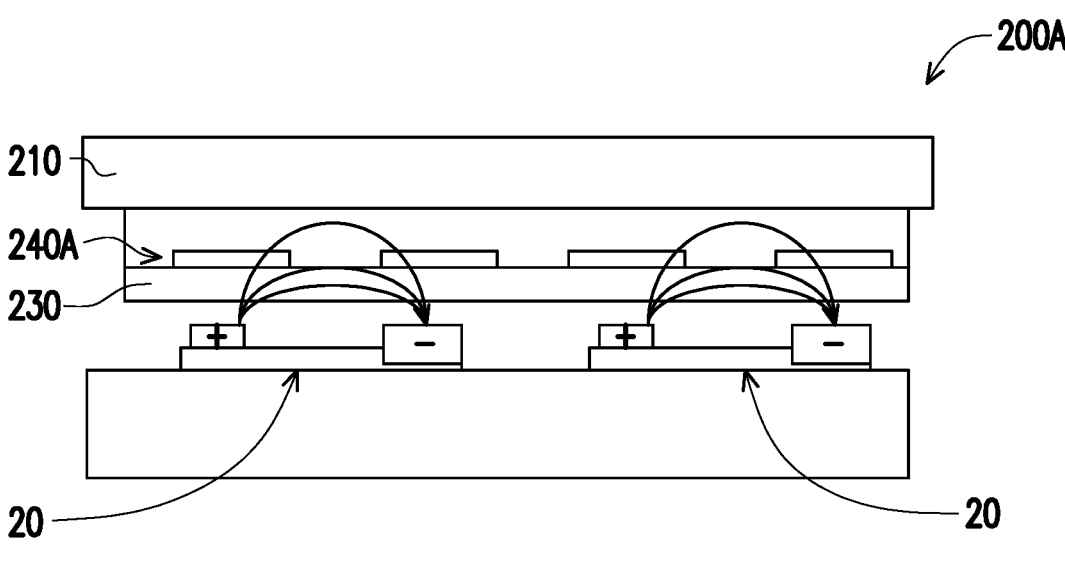
FIG. 6A and FIG. 6B are schematic diagrams of a voltage-sensing film approaching a plurality of light-emitting diodes of different embodiments of the disclosure, respectively.
Figure 6B:
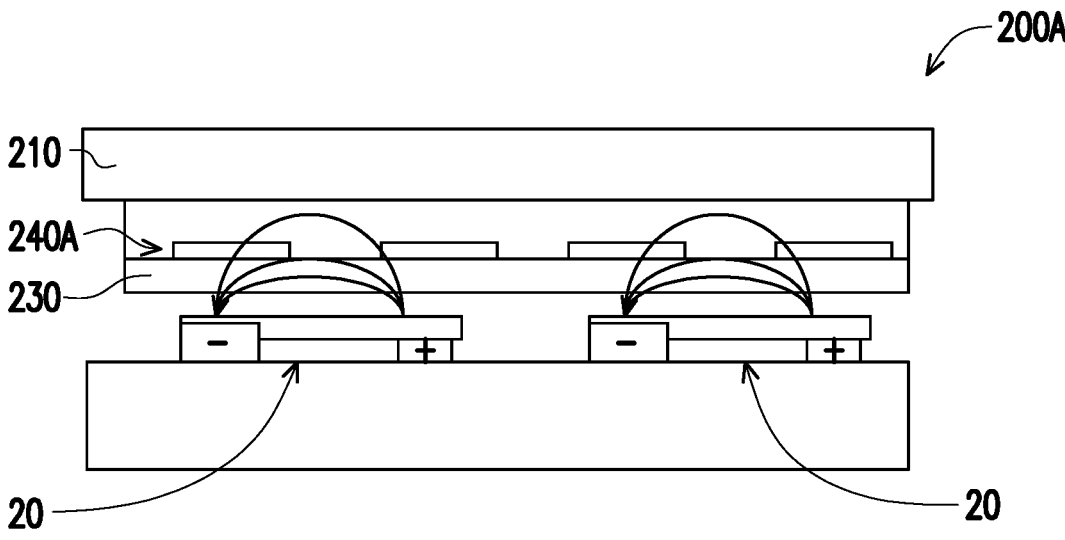

FIG. 6A and FIG. 6B are schematic diagrams of a voltage-sensing film approaching a plurality of light-emitting diodes of different embodiments of the disclosure, respectively. Please refer to FIG. 6A and FIG. 6B. A voltage-sensing film 200A of the present embodiment is similar to the voltage-sensing film 200 shown in FIG. 2A. The difference between the two is that, in the present embodiment, a first electrode layer 240A is connected to the second substrate 230. Specifically, the first electrode layer 240A includes a plurality of floating electrodes arranged at intervals along the arrangement direction, and the plurality of floating electrodes generate a induced voltage according to a plurality of open-circuit voltages of the plurality of light-emitting diodes 20. The induced voltage effect is changed according to the size of the arrangement interval of the plurality of floating electrodes. In other words, in the present embodiment, the driving voltage is a induced voltage generated by sensing the plurality of open-circuit voltages via the first electrode layer 240A. Therefore, the floating electrodes may be formed near the plurality of light-emitting diodes 20, and a induced voltage may be generated by sensing the charges of the light-emitting diodes 20 below, and the voltage sensing sensitivity of the voltage-sensing film 200A may be improved by using the pattern change of the floating electrodes. In other words, the induced voltage generated by the first electrode layer 240 provides an open-circuit voltage gain effect. In other embodiments, the electrodes of the light-emitting diodes 20 are located below, as shown in FIG. 6B.

Figure 7:
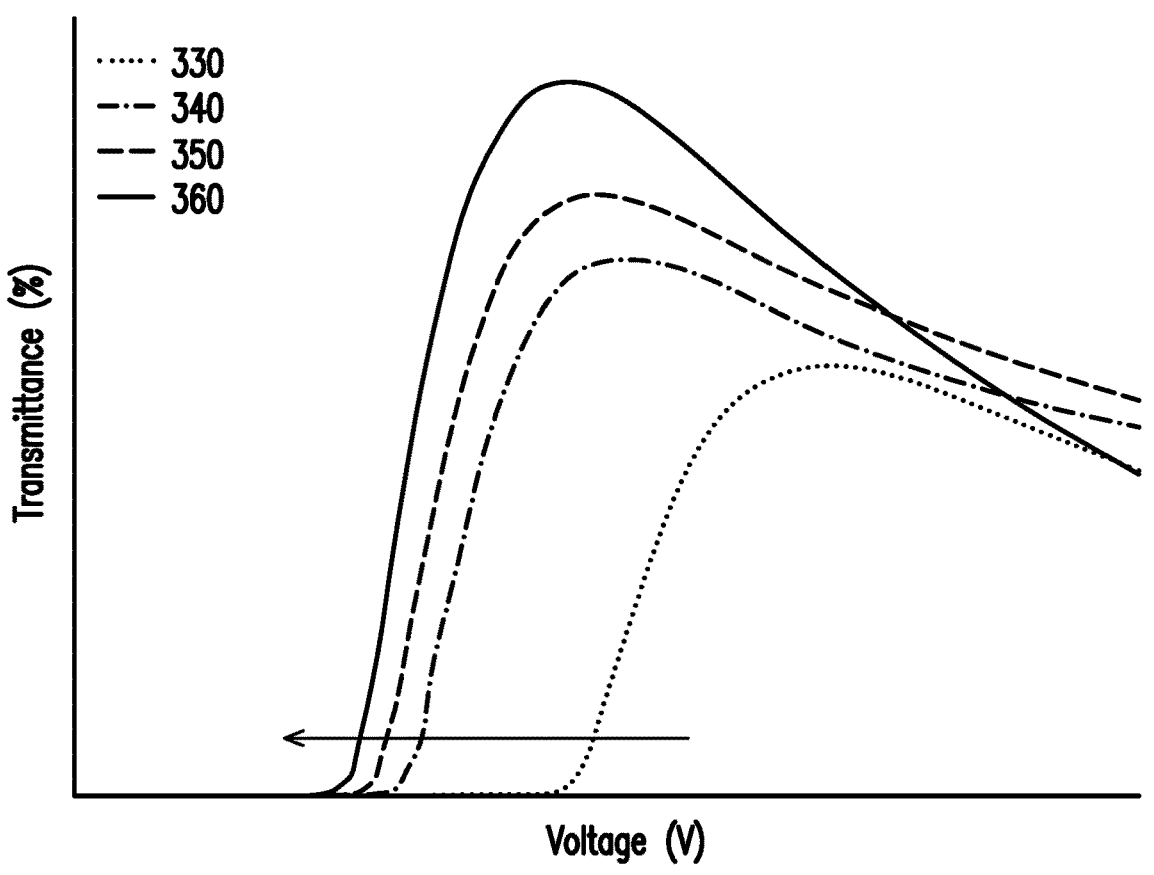
FIG. 7 is a graph of the transmittance of a voltage-sensing medium layer versus the voltage under a voltage-sensing film of different embodiments of the disclosure.

FIG. 7 is a graph of the transmittance of a voltage-sensing medium layer versus the voltage under a voltage-sensing film of different embodiments of the disclosure. Please refer to FIG. 7. A curve 330 is a working curve when the electrode intervals of the object to be tested are all 10 μm, a curve 340 is a working curve when the electrode intervals of the object to be tested are all 5 μm, a curve 350 is a working curve when the electrode intervals of the object to be tested are all 4 μm, and a curve 360 is a working curve when the electrode intervals of the object to be tested are all 3 μm. When the voltage-sensing film 200A is placed on the plurality of light-emitting diodes 20, the voltage under the voltage-sensing film is the open-circuit voltage of the diodes. It may be seen from the graph that the greater the electrode spacing of the device to be tested, the sensible voltage under the voltage—sensing film become larger. However, due to the application requirements of the test device, the electrode spacing has a certain range, and the voltage or electric field that may be generated is in a limited range.

Please refer to FIG. 6A and FIG. 7 at the same time. The voltage-sensing film 200A generates a transmittance change according to a voltage under it. In the present embodiment, the driving voltage is the induced voltage generated by measuring the plurality of open-circuit voltages via the first electrode layer 240A, or referred to as the floating electrodes, which is equivalent to the open-circuit voltage gain effect provided by the first electrode layer 240A. Light-emitting diodes 20 of a horizontal architecture are exemplified here. The electric field in the voltage-sensing medium layer has a direction parallel to an extending direction of the substrate with the light-emitting diodes 20. The limitation of device electrode spacing having a certain range is overcome via the design of floating electrode spacing size, so that the portion with a large change in transmittance of the curve is moved toward a small voltage, so that the voltage-sensing medium layer have a change in transmittance within limited open-circuit voltage range of sensing the light-emitting diodes 20, or transmittance is changed during small voltages.

Figure 8A:
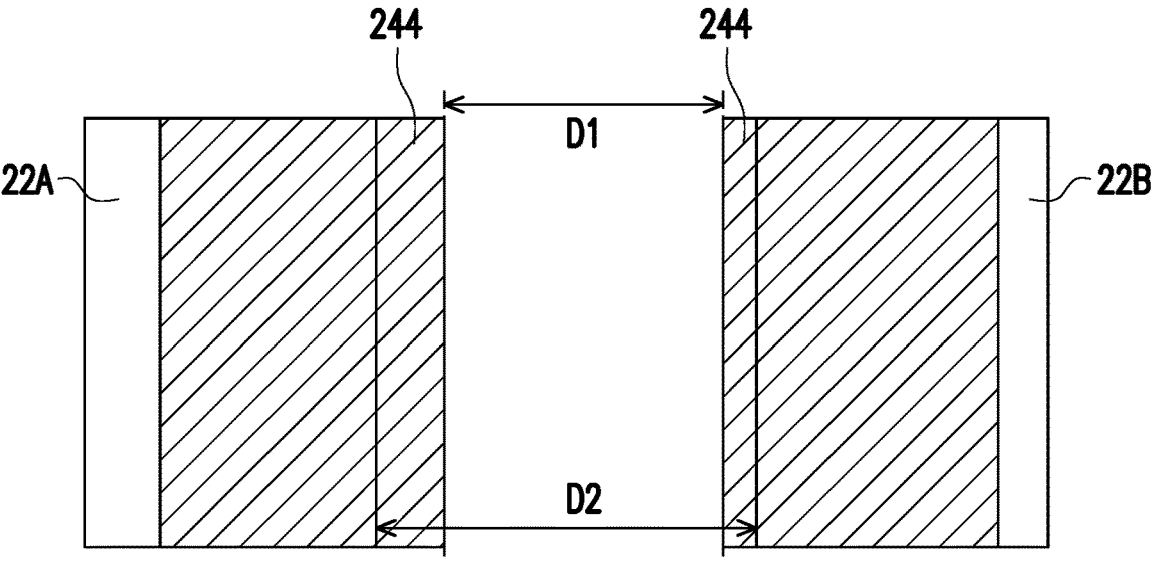
FIG. 8A to FIG. 8C are schematic top views of a first electrode layer and a plurality of light-emitting diodes of different embodiments of the disclosure, respectively.
Figure 8B:
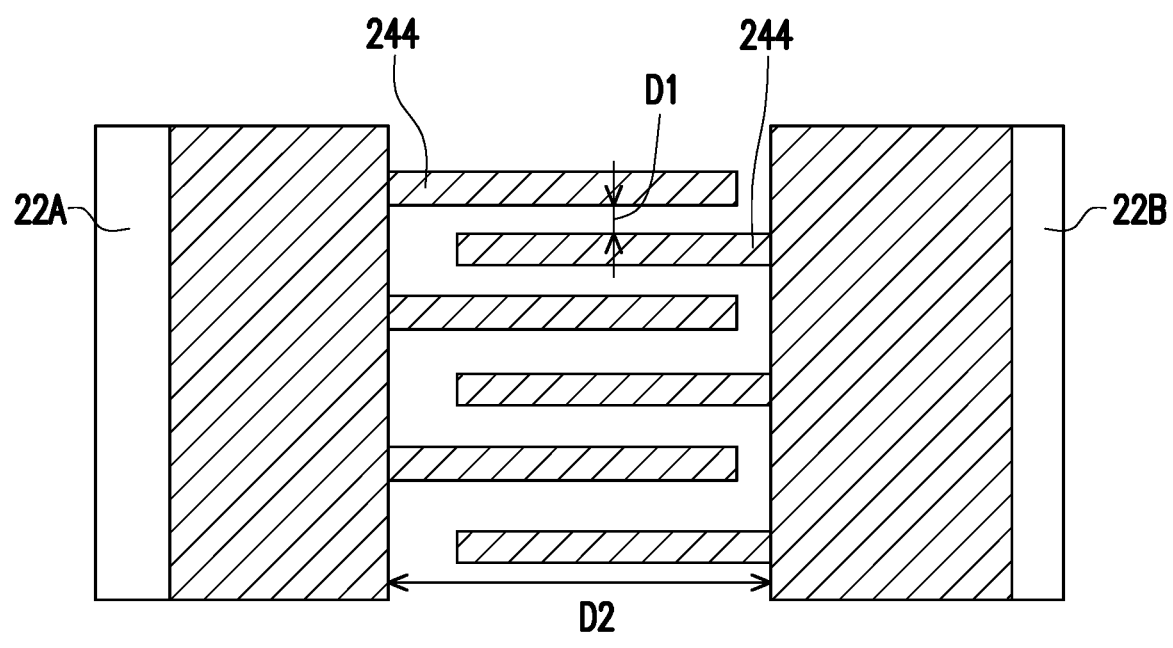
Figure 8C:
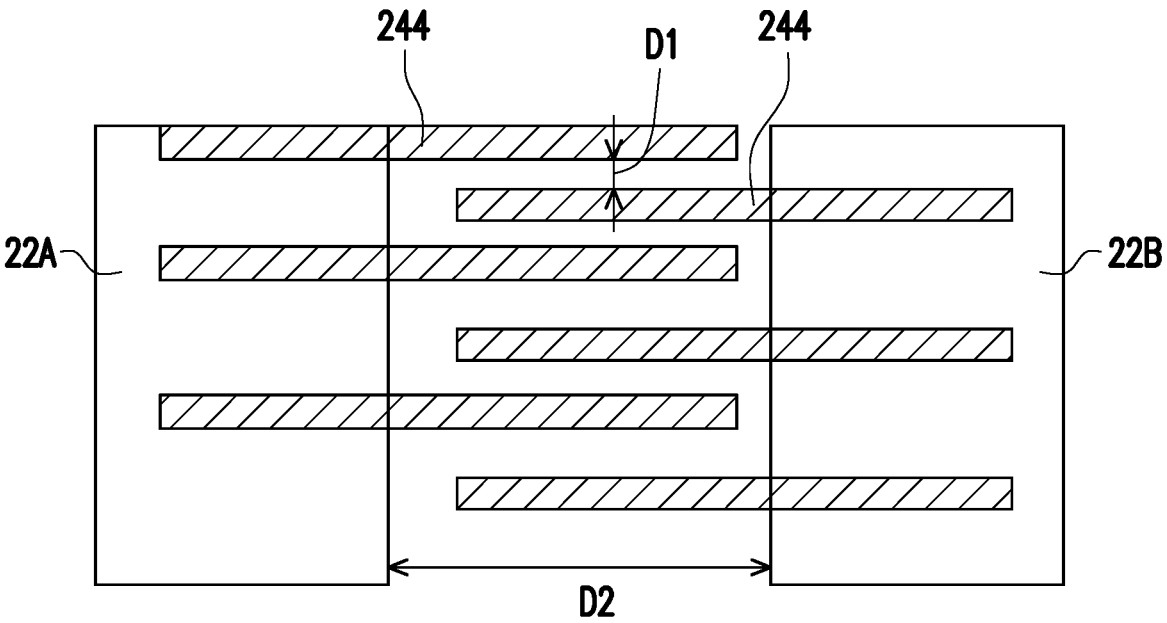

FIG. 8A to FIG. 8C are schematic top views of a first electrode layer and a plurality of light-emitting diodes of different embodiments of the disclosure, respectively. In the voltage-sensing film 200A, the distribution of the first electrode layer 240A in the stacking direction to the projection of the plurality of light-emitting diodes 20 may be distributed in different ways according to different requirements. Please refer to FIG. 6A and FIG. 8A first. In the embodiment of FIG. 8A, the arrangement direction of the first electrode layer 240A is parallel to the arrangement direction of the electrodes in the plurality of light-emitting diodes 20. Specifically, the first electrode layer 240A includes a plurality of floating electrodes 244 arranged at intervals along the arrangement direction, the arrangement direction of the plurality of floating electrodes 244 is parallel to the arrangement direction of the plurality of device electrodes 22, and the plurality of floating electrodes 244 generate an induced voltage from open-circuit voltages. Moreover, an interval width D1 of the plurality of floating electrodes 244 is less than an interval width D2 of the two device electrodes 22A and 22B, and at least a partial region of the plurality of floating electrodes 244 is overlapped with the device electrodes 22A and 22B in the stacking direction (that is, the projection of at least a portion of the floating electrodes 244 along the stacking direction is overlapped with the device electrodes 22A and 22B), and the induced voltages generated by the device electrodes 22A and 22B in the floating electrodes 244 are in different electrodes that are not connected. In particular, the interval width D1 of the floating electrodes 244 is less than the interval width D2 of the two device electrodes 22A and 22B, so that the portion of the curve with a large change in transmittance is moved toward a small voltage, or transmittance is changed at a small voltage, and the disclosure is not limited thereto.

In the embodiment of FIG. 8B, a plurality of strip electrodes may be designed to be extended perpendicular to the stacking direction (i.e., the horizontal direction) in the overlap region of the plurality of floating electrodes 244 and the device electrodes 22A and 22B in the stacking direction (i.e., the vertical direction), and staggered above the center interval of the two device electrodes 22A and 22B. In addition, the interval width D1 of the plurality of floating electrodes 244 staggered above the center interval of the two device electrodes 22A and 22B is less than the interval width D2 of the two device electrodes 22A and 22B. In the embodiment of FIG. 8C, the region of the floating electrodes 244 overlapped with the device electrodes 22A and 22B in the stacking direction is reduced in the embodiment of FIG. 8B, and similar to the embodiment of FIG. 8B, the interval width D1 of the plurality of floating electrodes 244 staggered above the center interval of the two device electrodes 22A and 22B is less than the interval width D2 of the two device electrodes 22A and 22B.

Figure 9A:
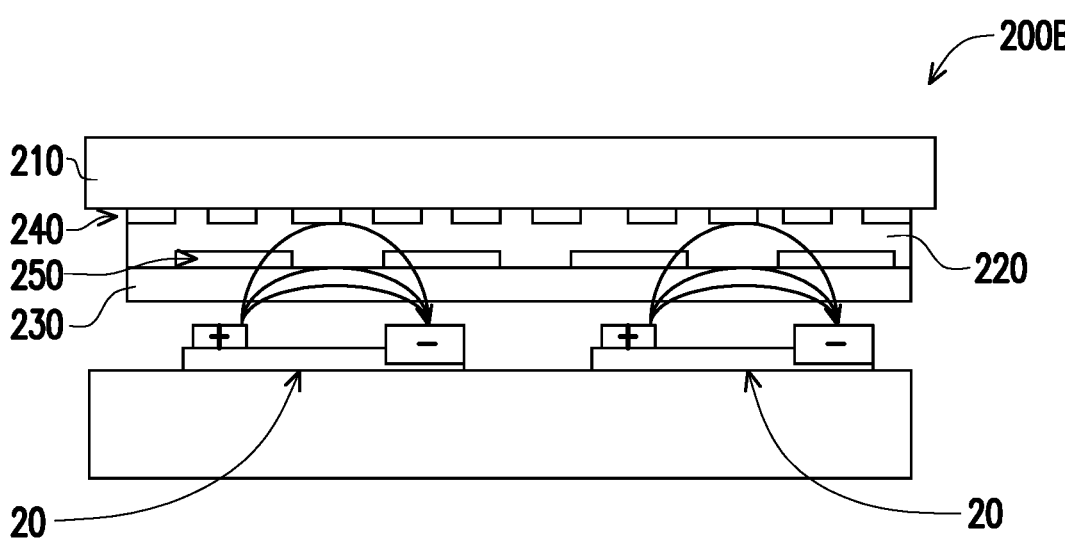
FIG. 9A and FIG. 9B are schematic diagrams of a voltage-sensing film approaching a plurality of light-emitting diodes of different embodiments of the disclosure, respectively.
Figure 9B:
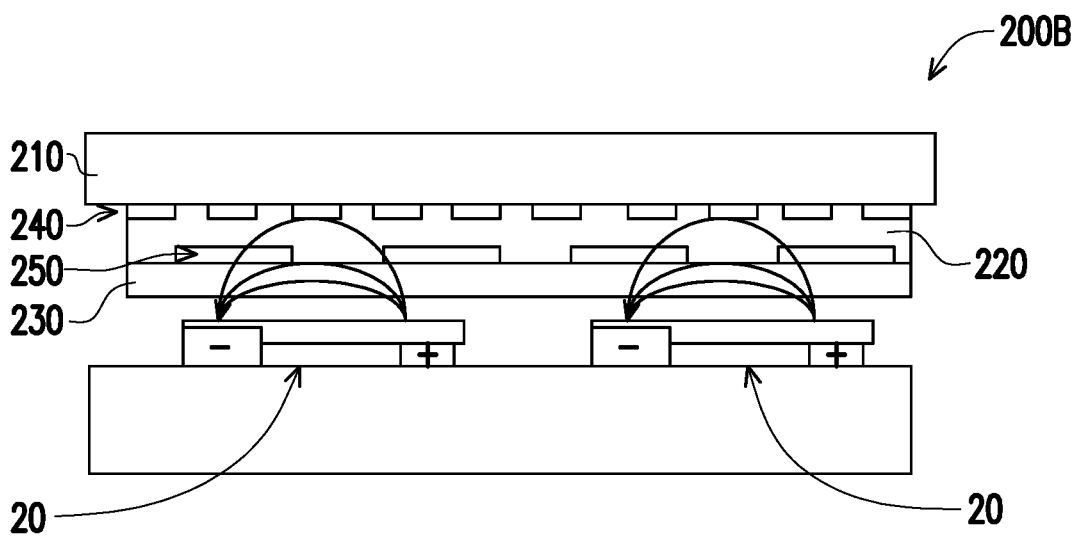
Figure 10A:
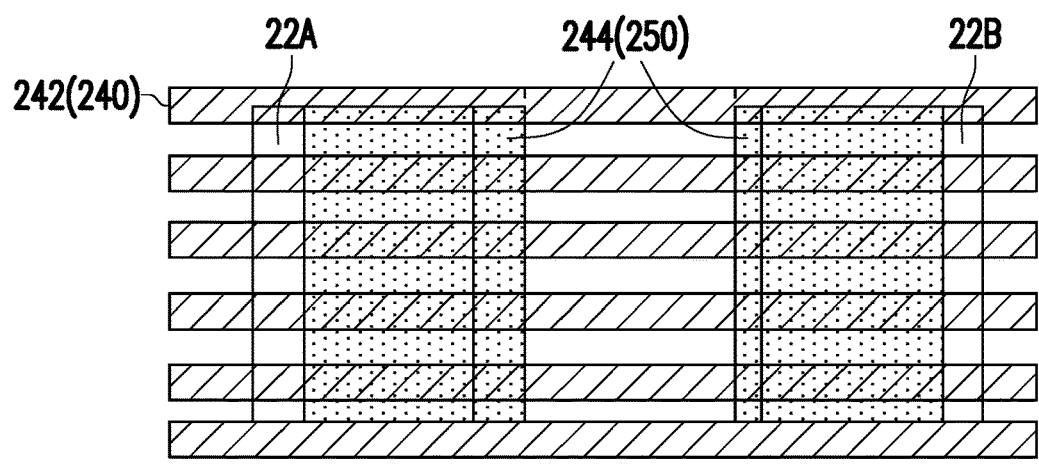
FIG. 10A to FIG. 10F are schematic top views of a first electrode layer, a second electrode layer, and a plurality of light-emitting diodes of different embodiments of the disclosure, respectively.
Figure 10B:
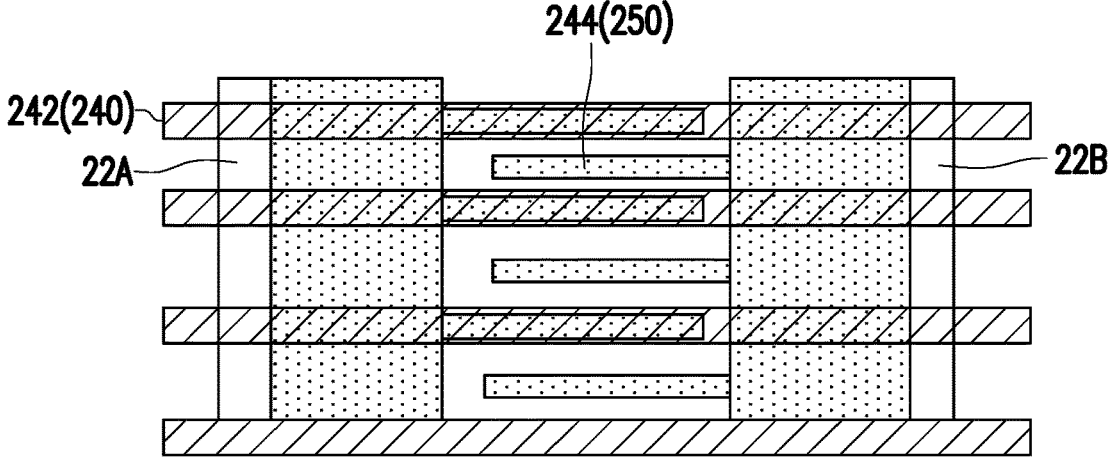
Figure 10C:
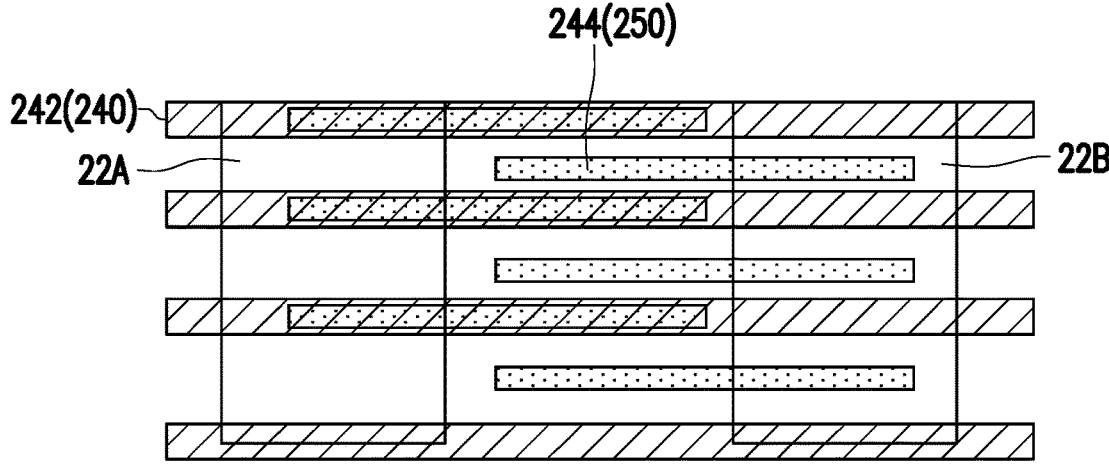
Figure 10D:
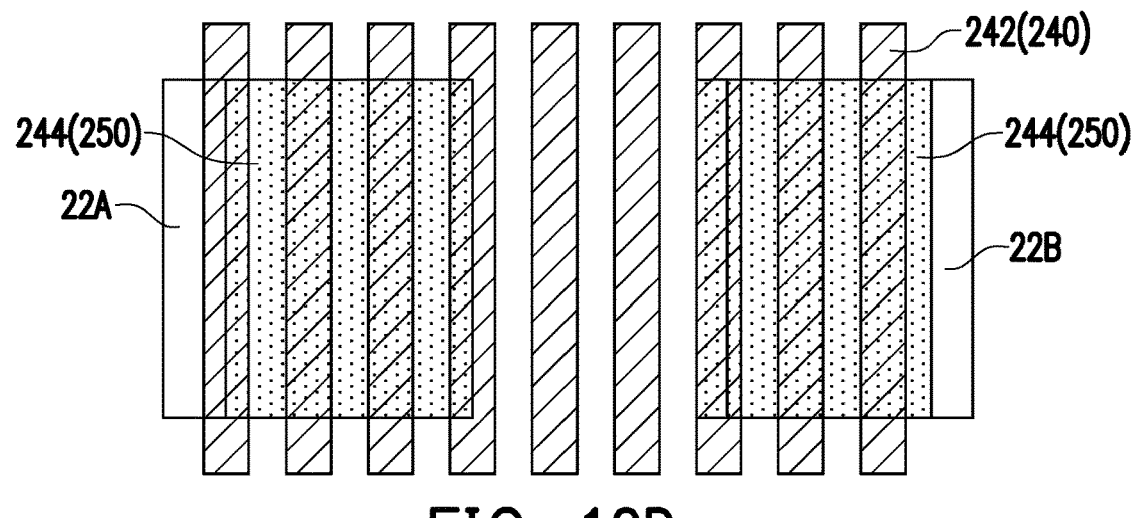
Figure 10E:
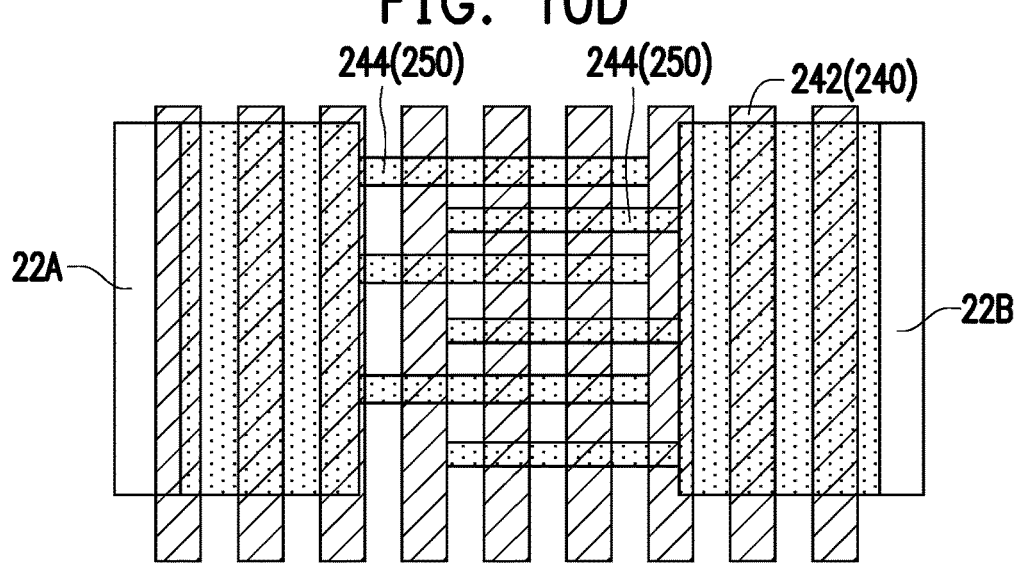
Figure 10F:
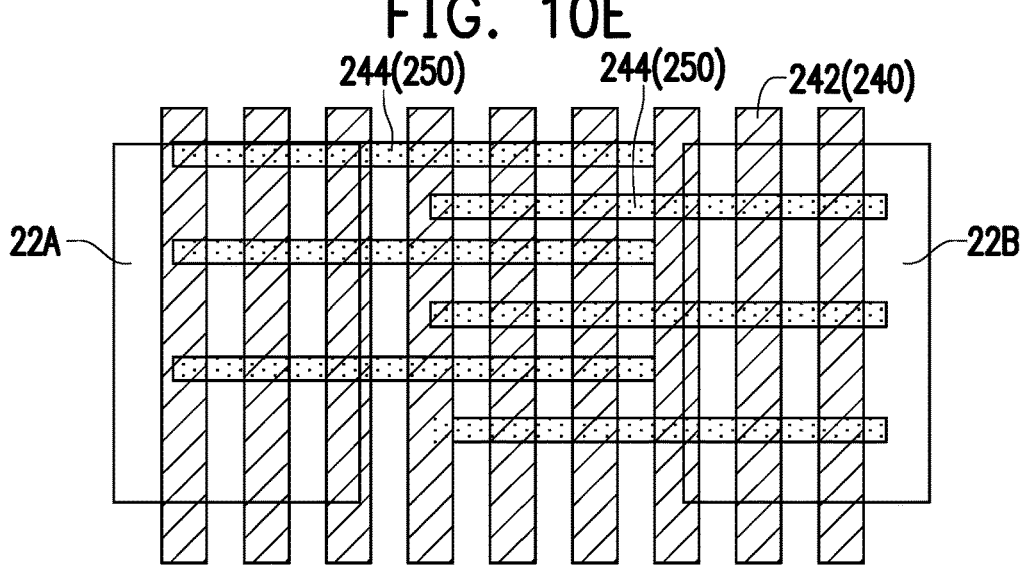

FIG. 9A and FIG. 9B are schematic diagrams of a voltage-sensing film approaching a plurality of light-emitting diodes of different embodiments of the disclosure, respectively. Please refer to FIG. 9A and FIG. 9B. A voltage-sensing film 200B of the present embodiment is similar to the voltage-sensing film 200 shown in FIG. 2A and the voltage-sensing film 200A shown in FIG. 6A. The difference between the two is that, in the present embodiment, the voltage-sensing film 200B further includes a second electrode layer 250 disposed at the voltage-sensing medium layer 230. In particular, the first electrode layer 240 is connected to the first substrate 210, and the second electrode layer 250 is connected to the second substrate 230. For example, in the present embodiment, the first electrode layer 240 includes a plurality of strip electrodes 242 (please refer to FIG. 10A-10F) arranged at intervals along the first arrangement direction, and the second electrode layer 250 includes the plurality of floating electrodes 244 (please refer to FIG. 10A-10F) arranged at intervals along the second arrangement direction. The electrode arrangement direction of the first electrode layer 240 is perpendicular or parallel to the electrode arrangement direction of the second electrode layer 250. That is, the first arrangement direction may be perpendicular or parallel to the second arrangement direction. In this way, under this architecture, the voltage-sensing film 200B has the strip electrodes 242 and the floating electrodes 244. The floating electrodes 244 may induce by the charges of the electrodes of the light-emitting diode 20s below to generate an induced voltage, and the strip electrodes 242 provide an external bias voltage. Both the first electrode layer 240 and the second electrode layer 250 provide an open-circuit voltage gain effect, allowing the voltage-sensing medium layer 220 to have a change in the display within a limited open-circuit voltage range of the sensing light-emitting diodes 20. At this time, the driving voltage is a combined effect of the applied bias voltage provided by activating the first electrode layer 240 and the induced voltage generated by the plurality of open-circuit voltages. The working curve of the voltage-sensing film 200B is adjusted to the optimum range by the bias voltage provided by the first electrode layer 240 and the parameters of the voltage-sensing film 200B. In addition, by utilizing the pattern change of the floating electrodes 244, the voltage sensing sensitivity of the voltage-sensing film 200B may be further improved. In other words, in the present embodiment, the driving voltage is an induced voltage generated at the floating electrodes 244 by the plurality of open-circuit voltages and the external bias voltage provided by the activation of the first electrode layer 240. In other embodiments, the electrodes of the light-emitting diodes 20 are located below, as shown in FIG. 9B.

FIG. 10A to FIG. 10F are schematic top views of a first electrode layer, a second electrode layer, and a plurality of light-emitting diodes of different embodiments of the disclosure, respectively. Similar to the distribution methods of the embodiments of FIG. 4A to FIG. 4D and FIG. 8A to FIG. 8C, in the architecture of the embodiment of FIG. 9A, the first electrode layer 240 and the second electrode layer 250 may be designed to have the same arrangement direction or a vertical arrangement direction, and the overlap method of the first electrode layer 240 including strip electrodes 242 and the device electrodes 22A and 22B may be designed with reference to the method shown in FIG. 4A to FIG. 4D, and the overlap method of the second electrode layer 250 including floating electrodes 244 and the device electrodes 22A and 22B may be designed with reference to the method shown in FIG. 8A to FIG. 8C, and are not repeated herein.

Figure 11:
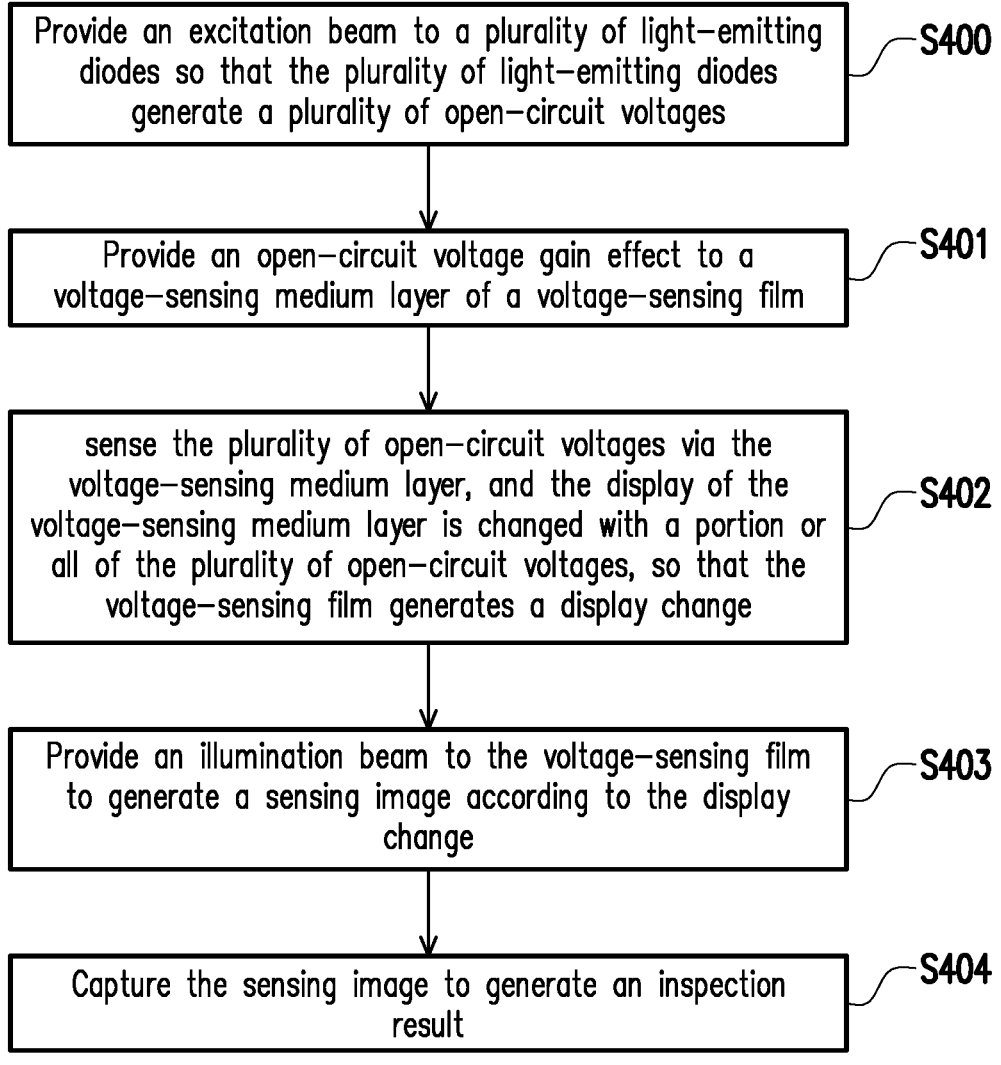
FIG. 11 is a flowchart of the steps of a method for inspecting a plurality of light-emitting diodes of an embodiment of the disclosure.

FIG. 11 is a flowchart of the steps of a method for inspecting a plurality of light-emitting diodes of an embodiment of the disclosure. Please refer to FIG. 1, FIG. 2A, and FIG. 11. The method for inspecting the plurality of light-emitting diodes of the present embodiment may be applied to at least the inspection system 100 shown in FIG. 1, so the following description takes the application to the inspection system 100 shown in FIG. 1 as an example. In the present embodiment, first, step S400 is performed to provide the excitation beam L1 to the plurality of light-emitting diodes 20 so that the plurality of light-emitting diodes 20 generate a plurality of open-circuit voltages. Then, after the above steps, step S401 is performed to provide a voltage gain effect to the voltage-sensing medium layer 220 of the voltage-sensing film 200. In particular, step S400 and step S401 do not have a fixed execution sequence, and may be performed interchangeably or simultaneously, and the disclosure is not limited thereto. Next, after the above step, step S402 is performed to sense the plurality of open-circuit voltages via the voltage-sensing medium layer 220, and the display of the voltage-sensing medium layer 220 is changed with a portion or all of the plurality of open-circuit voltages, so that the voltage-sensing film 200 generates a display change. Next, after the above step, step S403 is performed to provide the illumination beam L2 to the voltage-sensing film 200 to generate the sensing image L3 according to the display change. It should be mentioned that, the excitation beam L1 and the illumination beam L2 described in the above steps may be provided by the same light source at the same time, that is, the excitation beam L1 is used as the illumination beam L2, or two different light sources are disposed in the same position, and the disclosure is not limited thereto. Lastly, after the above step, step S404 is performed to capture the sensing image L3 to generate an inspection result. In this way, voltage sensing may be performed on the plurality of light-emitting diodes 20 via the voltage-sensing film 200, and corresponding display change may be generated according to the open-circuit voltages of the plurality of light-emitting diodes 20, so as to obtain a sensing image assembled by generating the bright and dark or color changes in the corresponding regions for inspection. The open-circuit voltages of the plurality of light-emitting diodes 20 are obtained according to the inspection result, so that the quality of each of the light-emitting diodes 20 (for example, using the obtained open-circuit voltages to classify each of the light-emitting diodes 20 as good or bad) may be determined from electrical characteristic data.

Based on the above, in the inspection system and the method for inspecting light-emitting diodes of the disclosure, the excitation beam is provided to the plurality of light-emitting diodes so that the plurality of light-emitting diodes generate the plurality of open-circuit voltages, and the voltage-sensing film generates the display change according to the driving voltage. In particular, the voltage-sensing film includes the voltage-sensing medium layer and the first electrode layer. The first electrode layer is disposed in the voltage-sensing medium layer to provide the gain effect of the plurality of open-circuit voltages, so that the voltage-sensing medium layer senses the plurality of open-circuit voltages, and the display of the voltage-sensing medium layer is changed with a portion or all of the open-circuit voltages. Then, the sensing image is generated according to the display change by providing the illumination beam to the voltage-sensing film, and the sensing image is captured to generate the inspection result. In this way, voltage sensing may be performed on the plurality of light-emitting diodes via the voltage-sensing film, and corresponding display change may be generated according to the driving voltage, so as to obtain a sensing image assembled by generating the bright and dark or color changes in the corresponding regions for inspection. The open-circuit voltages of the plurality of light-emitting diodes are obtained according to the inspection result, so that the quality of each of the light-emitting diodes may be determined from electrical characteristic data, so as to achieve rapid inspection of a large number of light-emitting diodes.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An inspection system, configured to inspect a plurality of light-emitting diodes, comprising:

an excitation light source configured to provide an excitation beam to the plurality of light-emitting diodes so that the plurality of light-emitting diodes generate a plurality of open-circuit voltages;

a voltage-sensing film located at a top side of the plurality of light-emitting diodes and configured to generate a display change according to a driving voltage, wherein the driving voltage is derived from at least the plurality of open-circuit voltages, and the voltage-sensing film comprises:

a voltage-sensing medium layer; and a first electrode layer disposed in the voltage-sensing medium layer to provide a gain effect of the plurality of open-circuit voltages, so that the voltage-sensing medium layer senses the plurality of open-circuit voltages, wherein the first electrode layer comprises a plurality of strip electrodes arranged at intervals along an arrangement direction, and an external bias voltage is provided to the plurality of strip electrodes such that a voltage difference is formed between adjacent strip electrodes;

an illumination light source providing an illumination beam to the voltage-sensing film to generate a sensing image according to the display change; and an image capture device disposed on a transmission path of the sensing image and configured to receive the sensing image to generate an inspection result, wherein an electric field corresponding to the plurality of open-circuit voltages has a direction parallel to an extending direction of a substrate with the plurality of light-emitting diodes.

2. The inspection system of claim 1, wherein the voltage-sensing medium layer is an in-plane switching liquid crystal, a fringe field switching liquid crystal, a homogeneously aligned bend liquid crystal, or a transverse bend mode vertical alignment liquid crystal.

3. The inspection system of claim 1, wherein an arrangement direction of the first electrode layer is perpendicular or parallel to an arrangement direction of electrodes in the plurality of light-emitting diodes.

4. The inspection system of claim 1, wherein the voltage-sensing film comprises:

a first substrate; and a second substrate, wherein the voltage-sensing medium layer is connected between the first substrate and the second substrate, and the first electrode layer is connected to the first substrate or the second substrate.

5. The inspection system of claim 4, wherein the first electrode layer is connected to the first substrate, and the plurality of strip electrodes are activated to provide an external bias voltage.

6. The inspection system of claim 5, wherein the plurality of light-emitting diodes comprise a plurality of device electrodes, and a number of the plurality of strip electrodes is an integer multiple of a number of the plurality of device electrodes.

7. The inspection system of claim 4, wherein the first electrode layer is connected to the second substrate, the first electrode layer comprises a plurality of floating electrodes arranged at intervals along an arrangement direction, and the plurality of floating electrodes generate a induced voltage according to the plurality of open-circuit voltages.

8. The inspection system of claim 7, wherein the plurality of light-emitting diodes comprise a plurality of device electrodes, and an interval width of the plurality of floating electrodes is less than an interval width of two device electrodes.

9. The inspection system of claim 8, wherein the plurality of floating electrodes and the plurality of device electrodes are overlapped in a stacking direction.

10. The inspection system of claim 4, wherein the voltage-sensing film further comprises a second electrode layer disposed on the voltage-sensing medium layer, the first electrode layer is connected to the first substrate, and the second electrode layer is connected to the second substrate.

11. The inspection system of claim 10, wherein an electrode arrangement direction of the first electrode layer is perpendicular or parallel to an electrode arrangement direction of the second electrode layer.

12. The inspection system of claim 4, wherein the voltage-sensing film further comprises a reflective layer disposed at an upper surface or a lower surface of the second substrate.

13. The inspection system of claim 1, further comprising:

a light-splitting element disposed on a transmission path of the illumination beam and configured to reflect the illumination beam to the voltage-sensing film and allowing the sensing image from the voltage-sensing film to pass through.

14. The inspection system of claim 1, wherein the excitation light source and the illumination light source are located at a bottom side and a top side of the plurality of light-emitting diodes, respectively.

15. The inspection system of claim 1, wherein the excitation light source and the illumination light source are substantially a same light-emitting device, and the excitation beam is the same as the illumination beam and transmitted to the plurality of light-emitting diodes from a same direction.

16. The inspection system of claim 1, wherein the excitation light source and the illumination light source are located at a same side of the plurality of light-emitting diodes, and the light-splitting element is also located on a transmission path of the excitation beam and configured to reflect the excitation beam to the voltage-sensing film.

17. The inspection system of claim 1, further comprising:

a light filter disposed on a transmission path of the illumination beam and located between the image capture device and the voltage-sensing film and configured to filter the excitation beam or a light generate by photoluminescence.

18. The inspection system of claim 17, wherein the light filter is a high-pass filter or a bandpass filter.

19. The inspection system of claim 17, wherein the light filter is a light attenuator.

20. The inspection system of claim 1, further comprising:
a processing element electrically connected to the image capture device and obtaining the open-circuit voltages of the plurality of light-emitting diodes according to the inspection result.

21. The inspection system of claim 1, wherein an electric field corresponding to a driving voltage of the voltage-sensing medium layer has a direction parallel to a direction of electric field corresponding to the plurality of open-circuit voltages of the plurality of light-emitting diodes.

22. A method for inspecting light-emitting diodes, configured to inspect a plurality of light-emitting diodes, the method comprising:
providing an excitation beam to the plurality of light-emitting diodes so that the plurality of light-emitting diodes generate a plurality of open-circuit voltages, wherein an electric field corresponding to the plurality of open-circuit voltages has a direction parallel to an extending direction of a substrate with the plurality of light-emitting diodes;
providing an open-circuit voltage gain effect to a voltage-sensing medium layer of a voltage-sensing film;
providing a first electrode layer comprising a plurality of strip electrodes arranged at intervals along an arrangement direction disposed in the voltage-sensing medium layer;
applying an external bias voltage to the plurality of strip electrodes such that a voltage difference is formed between adjacent strip electrodes;
sensing the plurality of open-circuit voltages via the voltage-sensing medium layer, and a display of the voltage-sensing medium layer is changed with a portion or all of the plurality of open-circuit voltages, so that the voltage-sensing film generates a display change;
providing an illumination beam to the voltage-sensing film to generate a sensing image according to the display change; and
capturing the sensing image to generate an inspection result.

23. The method for inspecting the light-emitting diodes of claim 22, wherein the method of providing the open-circuit voltage gain effect to the voltage-sensing medium layer of the voltage-sensing film further comprises:
providing an applied bias voltage upon activation.

24. The method for inspecting the light-emitting diodes of claim 22, wherein the method of providing the open-circuit voltage gain effect to the voltage-sensing medium layer of the voltage-sensing film further comprises:
generating a induced voltage according to the plurality of open-circuit voltages.

25. The method for inspecting the light-emitting diodes of claim 22, wherein the method of providing the illumination beam to the voltage-sensing film to generate the sensing image according to the display change further comprises:
providing the illumination beam through the voltage-sensing medium layer to generate the sensing image; and
reflecting the sensing image to the image capture device.

26. The method for inspecting the light-emitting diodes of claim 25, further comprising:
generating the inspection result according to the sensing image.

27. The method for inspecting the light-emitting diodes of claim 22, further comprising:
obtaining the plurality of open-circuit voltages of the plurality of light-emitting diodes according to the inspection result.

* * * * *